(12) United States Patent
Masuda et al.

(10) Patent No.: US 6,795,004 B2
(45) Date of Patent: Sep. 21, 2004

(54) DELTA-SIGMA MODULATION APPARATUS AND SIGNAL AMPLIFICATION APPARATUS

(75) Inventors: Toshihiko Masuda, Tokyo (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/416,443

(22) PCT Filed: Sep. 17, 2002

(86) PCT No.: PCT/JP02/09507
§ 371 (c)(1),
(2), (4) Date: May 12, 2003

(87) PCT Pub. No.: WO03/030373
PCT Pub. Date: Apr. 10, 2003

(65) Prior Publication Data
US 2004/0046680 A1 Mar. 11, 2004

(30) Foreign Application Priority Data
Sep. 28, 2001 (JP) ........................................ 2001-303543

(51) Int. Cl.[7] .............................................. H03M 3/00
(52) U.S. Cl. ........................ 341/143; 341/118; 341/120
(58) Field of Search ................................ 341/118, 120, 341/143

(56) References Cited
U.S. PATENT DOCUMENTS 5,784,017 A * 7/1998 Craven ........................ 341/126
6,359,575 B1 * 3/2002 Knudsen ...................... 341/118
6,373,417 B1 * 4/2002 Melanson ..................... 341/143
6,414,613 B1 * 7/2002 Midya et al. ................. 341/143
6,414,614 B1 * 7/2002 Melanson ..................... 341/143
6,480,129 B1 * 11/2002 Melanson ..................... 341/143
6,573,666 B1 * 6/2003 Killat .......................... 315/291
6,657,572 B2 * 12/2003 Lee et al. .................... 341/143

* cited by examiner

Primary Examiner—Michael Tokar
Assistant Examiner—Linh Van Nguyen
(74) Attorney, Agent, or Firm—Jay H. Maioli

(57) ABSTRACT

A signal amplifier apparatus adapted for carrying out delta-sigma modulation of an input signal to carry out pulse width modulation (PWM) of that signal, to obtain a PWM signal, and to amplify this PWM signal so that a signal of a predetermined magnitude is obtained, wherein the signal amplifier apparatus includes a correction circuit for correcting an output of a quantizer provided in a delta-sigma modulation device. The correction circuit is installed in a feedback path with respect to the input side from the quantizer or immediately before a pulse width modulator to thereby correct distortion taking place in the amplifier. In addition, the signal amplifier apparatus invention compares PWM signals at the input and the output of the amplifier to correct the output of the quantizer that is provided in the delta-sigma modulation device, so as to cancel distortion taking place in the amplifier in accordance with respective rising time difference and falling time difference to thereby correct distortion.

10 Claims, 18 Drawing Sheets

| OUTPUT SIGNAL S1 | OUTPUT SIGNAL S4 | PULSE WIDTH T0 OF OUTPUT SIGNAL S2 | PULSE WIDTH T1 OF OUTPUT SIGNAL S3 |
|---|---|---|---|
| ... | ... | ... | ... |
| $y_0$ | $y_1$ | $t_0$ | $t_1$ |
| ... | ... | ... | ... |

CORRECTION TABLE (columns: OUTPUT SIGNAL S1, OUTPUT SIGNAL S4)

FIG.6

DELTA-SIGMA MODULATION APPARATUS AND SIGNAL AMPLIFICATION APPARATUS

TECHNICAL FIELD

The present invention relates to a device for carrying out delta-sigma modulation of an audio signal which has been caused to undergo oversampling, and more particularly to a delta-sigma modulation device for correcting signal distortion produced when delta-sigma modulated signal is amplified by amplifier, and a signal amplifier apparatus comprising such delta-sigma modulation device.

BACKGROUND ART

Hitherto, as a method of improving S/N ratio in the audible band of audio signal, delta-sigma modulation system is known. In this delta-sigma modulation system, by the noise shaping technology, e.g., PCM digital signal of 16 bits or more is converted into quantization signal having lower number of bits from one bit to several bits to have ability to reproduce it into analog signal by local D/A converter of several bits.

Here, reproduction of audio signal utilizing the delta-sigma modulation system will be explained. A reproducing apparatus 9 which reproduces audio signal comprises, as shown in FIG. 1, a delta-sigma modulator 90, a Pulse Width Modulator 91, a switching module 92, a LPF (Low Pass filter) 93, and a speaker 94.

The delta-sigma modulator 90 comprises, as shown in FIG. 2, an input terminal supplied with an audio signal, a subtracter 191 for carrying out subtraction between audio signal and delay signal, an integrator 192 for integrating an output of the subtracter 191, a quantizer 193 for quantizing an output of the integrator 192 into a digital signal having lower number of bits, and a delay circuit 194 for delaying output S1 of the quantizer 193 by one clock (operating clock of the quantizer) to input it as a delay signal to the subtracter 191. In delta-sigma modulator 90, there is generated an audio signal distributed so that quantization noise is caused to be less in the Nyquist band which is the band having a frequency up to one half of sampling frequency of input audio signal and quantization noise is caused to be many in the frequency band more than the Nyquist band. For example, input audio signal is digital audio data having 24 bits and sampling frequency of 768 kHz (=48 kHz×16), and output audio signal is digital signal having 6 bits and sampling frequency of 768 kHz. The output audio signal S1 is inputted to the Pulse Width Modulator 91. The Pulse Width Modulator 91 carries out Pulse Width Modulation with respect to inputted audio signal.

The Pulse Width Modulated audio signal S2 is amplified by the switching module 92 into a pulse signal of a predetermined magnitude, and an audio signal of the audible band is outputted from the speaker 94 through the LPF 93.

Since the switching module 92 is ordinarily operative at a power supply voltage higher than input voltage, e.g., 20V~50V, distortion takes place in an output signal. Moreover, the output signal also experiences influence of counter-electromotive force by the coil of the LPF 93 or the speaker 94 so that it is difficult that there results ideal waveform.

For example, as shown in FIG. 3, in the above-described reproducing apparatus 9, signal S3 amplified by the switching module 92 is such that delay of signal takes place by $T_{rise}$ at the rising and by $T_{fall}$ at the falling with respect to the signal S2 which has been caused to undergo Pulse Width Modulation by the Pulse Width Modulator 91. As a result, there takes place the problem that pulse width of the signal S2 and that of the signal S3 are different from each other. There is the problem that ringing takes place at the rising and the falling in the signal S3 so that waveform like the signal S2 cannot be obtained.

Further, in the class D amplifier which drives the speaker 94 by signal S3 amplified by the switching module 92, since distortion of the signal S3 results in distortion of audio signal as it is so that such distortion is outputted from the speaker 94, there is the problem that the audio characteristic such as distortion ratio and/or S/N ratio, etc. is deteriorated.

In order to eliminate this distortion, a class D power amplifier as described in, e.g., the Japanese Patent Application Laid Open No. 214259/1997 publication is proposed. In this class D amplifier, waveform distortion by power supply ripple taking place at the power switch and/or waveform distortion by overshoot or ringing, etc. are suppressed.

This class D amplifier comprises a delta-sigma modulation unit as described above, a power switch for power-amplifying an output signal of the delta-sigma modulation unit, a first LPF for smoothing an output of the power switch, a delay for delaying an output signal of the delta-sigma modulation unit, an attenuator for attenuating amplitude of an output signal of the power switch, an adder for calculating difference between an output signal of the delay and an output signal of the attenuator, a second LPF for smoothing an output signal of the adder, and a selector circuit for selecting reference level of a quantizer on the basis of an output signal of the second LPF. Input signal is converted into binary signal at the delta-sigma modulation unit. This binary signal is power-amplified at the power switch, and is smoothed at the first LPF. The signal thus obtained is delivered to load. On the other hand, the delay delays an output of the delta-sigma modulation unit. The attenuator attenuates amplitude of an output signal of the power switch equivalently to amplitude of an output signal of the delay. Further, the adder calculates difference between an output signal of the delay and an output signal of the attenuator to smooth it at the second LPF to thereby detect waveform distortion taking place at the power switch. The selector circuit selects reference level of 1 bit quantizer in accordance with this waveform distortion quantity. As a result, the delta-sigma modulation unit converts input signal into binary signal so as to cancel waveform distortion. In this way, waveform distortion is cancelled.

Since the class D power amplifier described in the above-mentioned publication serves to change the reference level of the quantizer, in the case where a signal of high level is inputted to the quantizer, there is the problem that signal is clipped. Moreover, in the class D power amplifier, in the case where level of a signal inputted to the quantizer is suppressed to be low in order not to cause this clip, there is the problem that S/N ratio is deteriorated.

In addition, in the class D amplifier adapted for driving speaker by signal amplified by the switching module, since distortion of signal results in distortion of audio signal as it is so that it is outputted from the speaker, there is the problem that the audio characteristic such as distortion ratio and/or S/N ratio, etc. is deteriorated.

DISCLOSURE OF THE INVENTION

An object of the present invention is to provide a novel delta-sigma modulation device and a novel signal amplifier apparatus which can solve problems that conventional apparatuses as described above have.

Another object of the present invention is to provide a delta-sigma modulation device which corrects in advance distortion taking place at the switching module, and a signal amplifier apparatus using such delta-sigma modulation device.

A further object of the present invention is to provide a signal amplifier apparatus which corrects in advance distortion taking place at the switching module by a feedback circuit.

A delta-sigma modulation device according to the present invention proposed in order to attain objects as described above is directed to a delta-sigma modulation device comprising a quantizer and operative to feed output or quantization error of this quantizer back to the input side as a feedback signal, the delta-sigma modulation device comprising a correction circuit for correcting output signal or quantization error of the quantizer to allow it to be a feedback signal, thus to correct, by the correction circuit, distortion taking place by circuit or circuits connected to the succeeding stage of this delta-sigma modulation device.

The delta-sigma modulation device according to the present invention installs (provides) correction circuit which corrects distortion that circuit or circuits connected to the succeeding stage from this delta-sigma modulation device generate within feedback path from output or quantization error of quantizer toward the input side to correct in advance distortion that circuit or circuits connected to the succeeding stage from this delta-sigma modulation device generate.

Another delta-sigma modulation device according to the present invention is directed to a delta-sigma modulation device comprising a quantizer and operative to feed output or quantization error of this quantizer back to the input side as a feedback signal, the delta-sigma modulation device comprising a correction circuit for correcting an output signal of the quantizer to deliver it to circuit or circuits connected to the succeeding stage of this delta-sigma modulation device, thus to correct, by the correction circuit, distortion taking place by the circuit or circuits of the succeeding stage.

This delta-sigma modulation device installs (provides) the correction circuit for correcting distortion that circuit or circuits connected to the succeeding stage from this delta-sigma modulation device generates between the quantizer and the circuit or circuits connected to the succeeding stage to correct in advance distortion that the circuit connected to the succeeding stage from this delta-sigma modulation device generate.

A signal amplifier apparatus according to the present invention proposed in order to attain the above-described objects comprises: a delta-sigma modulator including a quantizer and a correction circuit thus to correct output or quantization error of this quantizer by the correction circuit to feed it back to the input side as a feedback signal; a pulse width modulator for carrying out pulse width modulation of a signal outputted from the delta-sigma modulator, an amplifier for amplifying the PWM (Pulse Width Modulated) signal outputted from the pulse width modulator to obtain an output signal, detecting means for detecting distortion quantity at the amplifier from the PWM signal and the output signal, and a correction circuit for correcting output of the quantizer of the delta-sigma modulator in accordance with distortion quantity detected at the detecting means to allow it to be a feedback signal.

This signal amplifier apparatus is operative to compare a signal inputted to the amplifier and a signal outputted therefrom by the detecting means to detect rising time difference and falling time difference of those signals to calculate distortion quantity taking place at amplifier output by the characteristic of circuit or circuits connected to the stages succeeding to the amplifier from the rising time difference and the falling time difference which have been detected to feed this calculated distortion quantity back to the delta-sigma modulator.

Another signal amplifier apparatus according to the present invention comprises: a delta-sigma modulator; a correction circuit for correcting a signal outputted from the delta-sigma modulator on the basis of a correction signal; a pulse width modulator for carrying out pulse width modulation of a signal outputted from the correction circuit, an amplifier for amplifying the PWM (Pulse Width Modulated) signal outputted from the pulse width modulator to obtain an output signal; and detecting means for detecting distortion quantity at the amplifier from the PWM signal and the output signal to provide the correction signal corresponding to the detected distortion quantity.

This signal amplifier apparatus is operative to compare signal inputted to the amplifier and signal outputted therefrom by the detecting means to detect rising time difference and falling time difference of those signals to calculate distortion quantity taking place at the amplifier output by the characteristic of circuit or circuits connected to the stage succeeding to the amplifier from the rising time difference and the falling time difference which have been detected to feed a correction signal corresponding to the calculated distortion quantity back to the correction circuit.

Still further objects of the present invention and practical merits obtained by the present invention will become more apparent from the embodiments which will be given below with reference to the attached drawings.

BRIEF DESCRIPTION OF THE DRAWINGS

FIG. 6 is a view showing correction table of correction circuit that the class D power amplifier apparatus to which the present invention is applied has.

BEST MODE FOR CARRYING OUT THE INVENTION

Embodiments of a delta-sigma modulation device and a signal amplifier apparatus according to the present invention will now be described with reference to the attached drawings.

First, explanation will be given by taking the example where the present invention is applied to the class D power amplifier apparatus.

Figure 4:
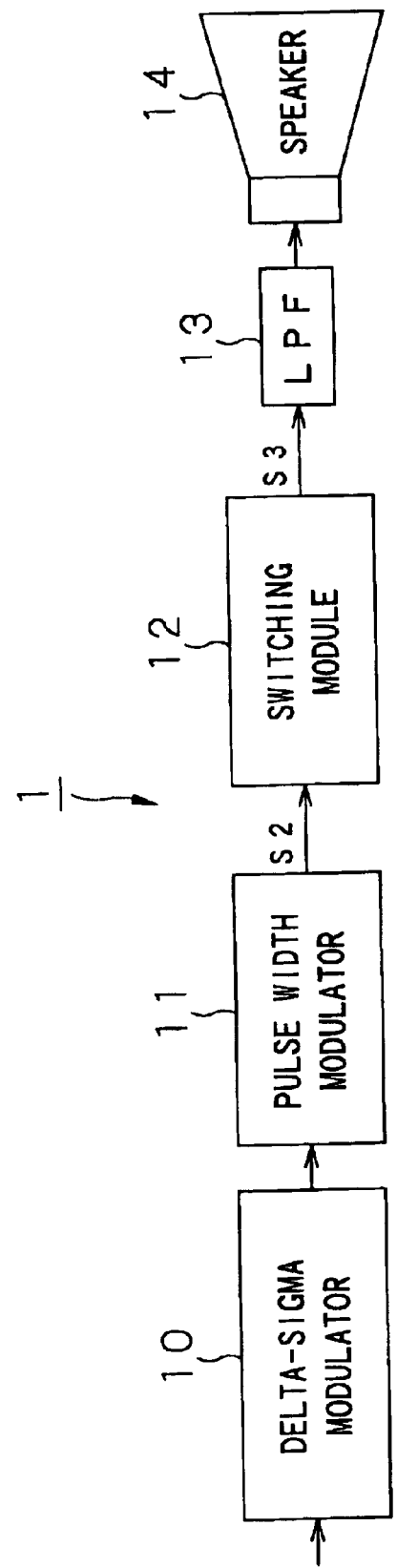
FIG. 4 is a block diagram of a class D power amplifier apparatus for amplifying audio signal to which the present invention is applied.

The class D power amplifier apparatus 1 to which the present invention is applied comprises, as shown in FIG. 4, a delta-sigma modulator 10 for carrying out delta-sigma modulation of audio signal, a Pulse Width Modulator 11 for carrying out PWM (Pulse width Modulation) of the delta-sigma modulated signal, a switching module 12 for amplifying the PWM (Pulse Width Modulated) signal S2 into a signal of a predetermined magnitude, and a LPF (Low Pass Filter) 13 for carrying out filter processing with respect to signal S3 amplified so as to have the predetermined magnitude to remove frequency component of the high frequency band. The signal from which the frequency component of the high frequency band has been removed by the LPF 13 is delivered to a speaker 14. Thus, audio signal of the audible band is reproduced.

Here, the delta-sigma modulation method will be described. In the case where signal is sampled, double value of the maximum frequency $f_0$ of analog signal is the Nyquist frequency $2f_0$. When sampling is carried out by sampling frequency $f_s$ smaller than this Nyquist frequency $2f_0$, spectrum of frequency component higher than $f_s/2$ is outputted in the state caused to undergo aliasing toward the lower frequency side in regard to $f_s/2$. This is called aliasing distortion or aliasing noise. When an inputted signal is inputted to integrator to convert that output into a bit stream signal of lower number of bits by quantizer to feed that signal back to the integrator to apply a sort of negative feedback thereto, input of the integrator is an error between an input signal and a signal which has been caused to undergo digital conversion, and digital output is provided so that the error becomes equal to 0. Such a modulation method is called delta-sigma modulation method. The integrator within the loop has action (function) of noise shaping to drive out quantization noise toward the higher frequency band. That action becomes great according as order of the integrator becomes high. The conversion accuracy becomes higher according as the sampling freqency of the quantizer becomes higher. For this reason, there are many cases where the oversampling technology is used in combination.

In the delta-sigma modulation method, it is possible to simply carry out pre-processing (antialiasing) for preventing this aliasing distortion. In the case where the maximum frequency $f_0$ of input signal and the sampling frequency $f_s$ are close to each other, the pre-processing circuit (antialiasing filter) is required to have sharp characteristic. Since realization of such an analog filter is difficult, bad influence is not a little given also to signal. In view of the above, when quantization is carried out at frequency higher than the primary sampling frequency $f_s$, the Nyquist frequency $2f_0$ also shifts to the higher frequency band. Accordingly, analog filter of gentle characteristic can be used, and influence on signal is also reduced. Thereafter, signal component more than the primary Nyquist frequency $2f_0$ is removed to thin data by a predetermined time interval. Accordingly, in the delta-sigma modulation method, signal of higher frequency component can be removed without giving bad effect to signal.

In the delta-sigma modulation method, signal of higher frequency component is removed, thereby making it possible to carry out conversion into data having the number of quantization bits lesser than that of input data. Further, since the action of noise shaping is provided in combination, the number of quantization bits can be also reduced.

It is to be noted that the delta-sigma modulation method can be also applied in the case where D/A conversion is carried out, or in the case where A/D conversion is carried out. In the case where D/A conversion is carried out, the delta-sigma modulator 10 may be entirely assembled by digital circuit, and subtracter and/or integrator, etc. may be caused to be digital circuit.

In data conversion by the delta-sigma modulation system, the audio characteristic such as total harmonic distortion (ratio between total harmonic component and signal) and/or S/N ratio, etc. can be relatively easily realized with high performance, and, e.g., PCM digital signal of 16 bits or more is converted into quantization signal of lower number of bits from 1 bit to several bits by the noise shaping technology to have ability to reproduce it into a desired output signal by local converter of several bits.

Figure 5:
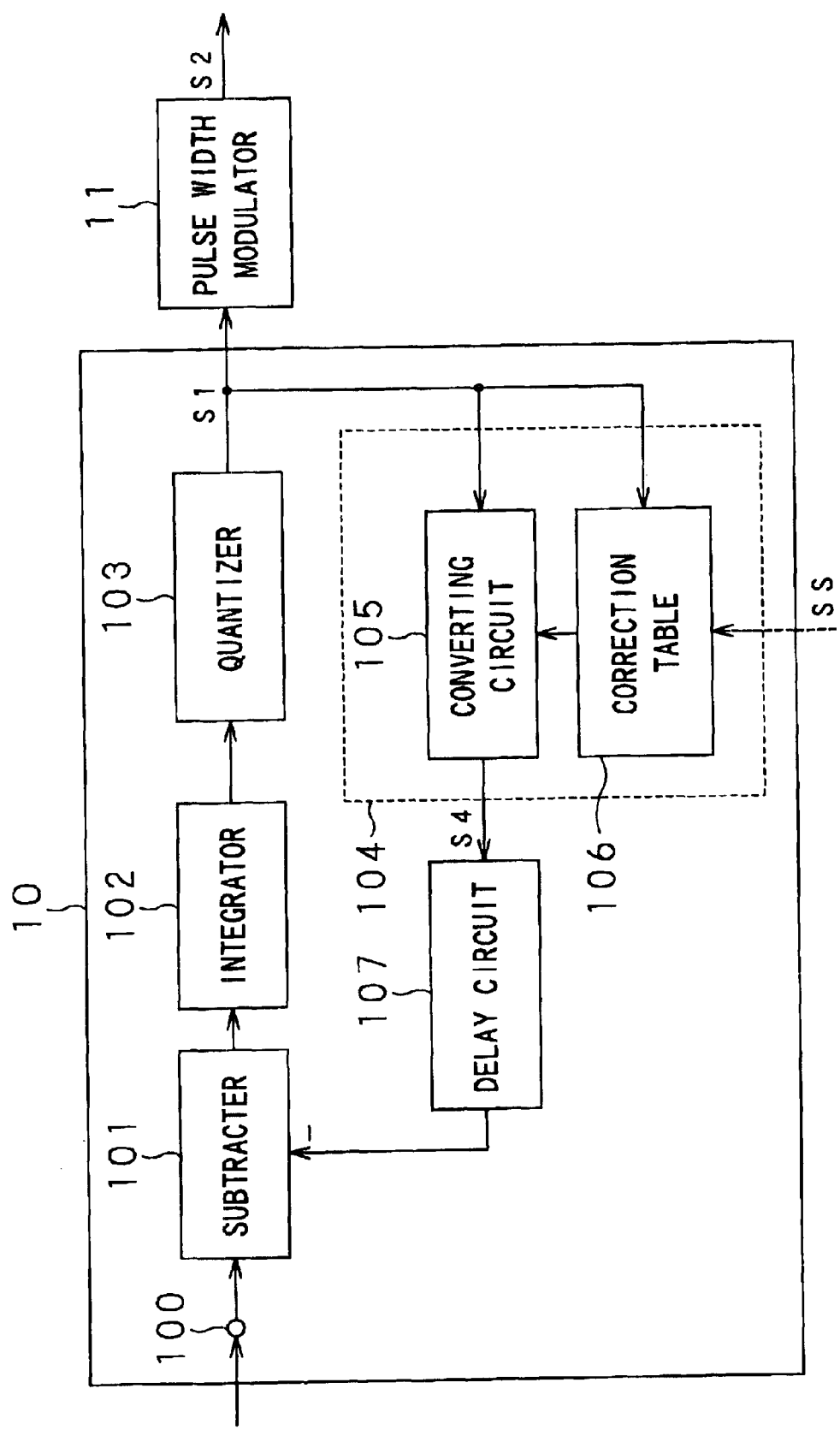
FIG. 5 is a block diagram of a first delta-sigma modulator that the class D power amplifier apparatus to which the present invention is applied has.

The delta-sigma modulator 10 adapted for carrying out delta-sigma modulation of signal by the above-described delta-sigma modulation method comprises, as shown in FIG. 5, an input terminal 100 supplied with an audio signal, a subtracter 101 for carrying out subtraction between audio signal and delay signal, an integrator 102 for integrating an output of the subtracter 101, a quantizer 103 for quantizing an output of the integrator 102 to output it, a correction circuit 104 within which correction table 106 which will be described later is included, and a delay circuit 107 for delaying output signal S4 of the correction circuit 104 by 1 clock (operating clock of the quantizer 103) to input it to the subtracter 101 as a delay signal. For example, input audio signal is digital audio data having 24 bits and sampling frequency of 768 kHz (=48 kHz×16), and output audio signal is digital signal having 6 bits and sampling frequency of 768 kHz.

The switching module 12 is an amplifier for amplifying signal by switching operation. The switching module 12 is a switch circuit for turning ON and OFF power supply. When the switching module 12 is turned ON, the maximum power is delivered. When the switching module is turned OFF, supply of power is stopped. When such ON and OFF operations are repeated by the same interval, half average output is obtained. If time of ON is long, large output is provided. If time of ON is short, small output is provided. The switching module 12 is an amplifier utilizing change of obtained average output by this ratio between ON and OFF. It is to be noted that the switching module 12 controls ratio between ON and OFF of switch in accordance with magnitude of pulse width of signal inputted from the Pulse Width Modulator 11.

Moreover, since the switching module 12 is ordinarily operative at a higher power supply voltage as compared to input signal, distortion takes place in an output signal. Further, distortion takes place also by the LPF 13. In the present invention, the correction circuit 104 including correction table 106 in which the characteristics of the switching module 12 and the LPF 13 which produce distortion are taken into consideration is installed (provided) at the delta-sigma modulator 10 to correct delta-sigma modulated output so as to correct in advance distortion taking place at the stage succeeding to the delta-sigma modulator 10 to make an operation so as to cancel that distortion in carrying out amplification at the Pulse Width Modulator 11 and the switching module. Explanation will be given below in connection with the correction table 106 that the correction circuit 104 has.

Figure 1:
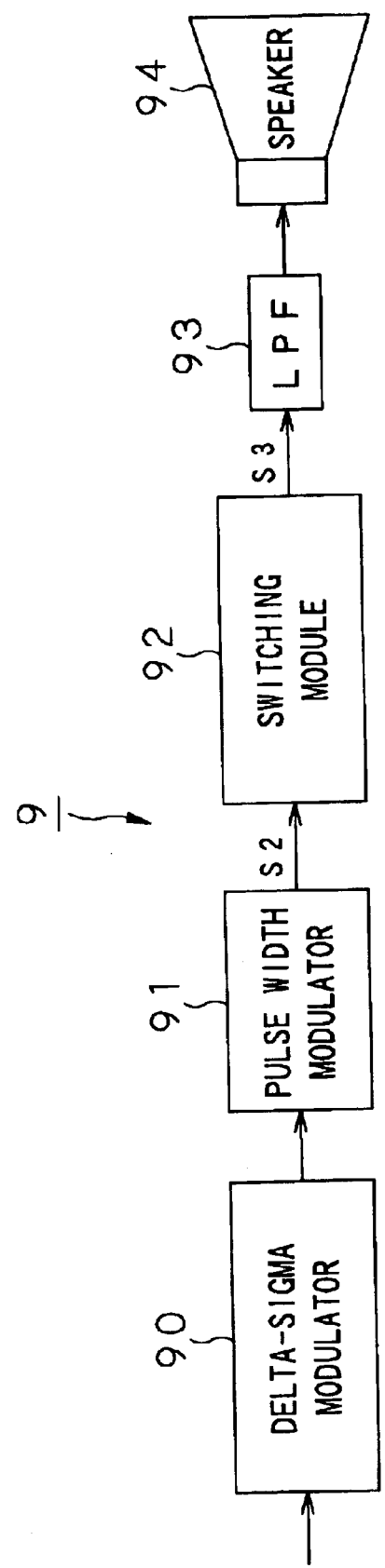
FIG. 1 is a block diagram of a reproducing apparatus for reproducing audio signal.
Figure 2:
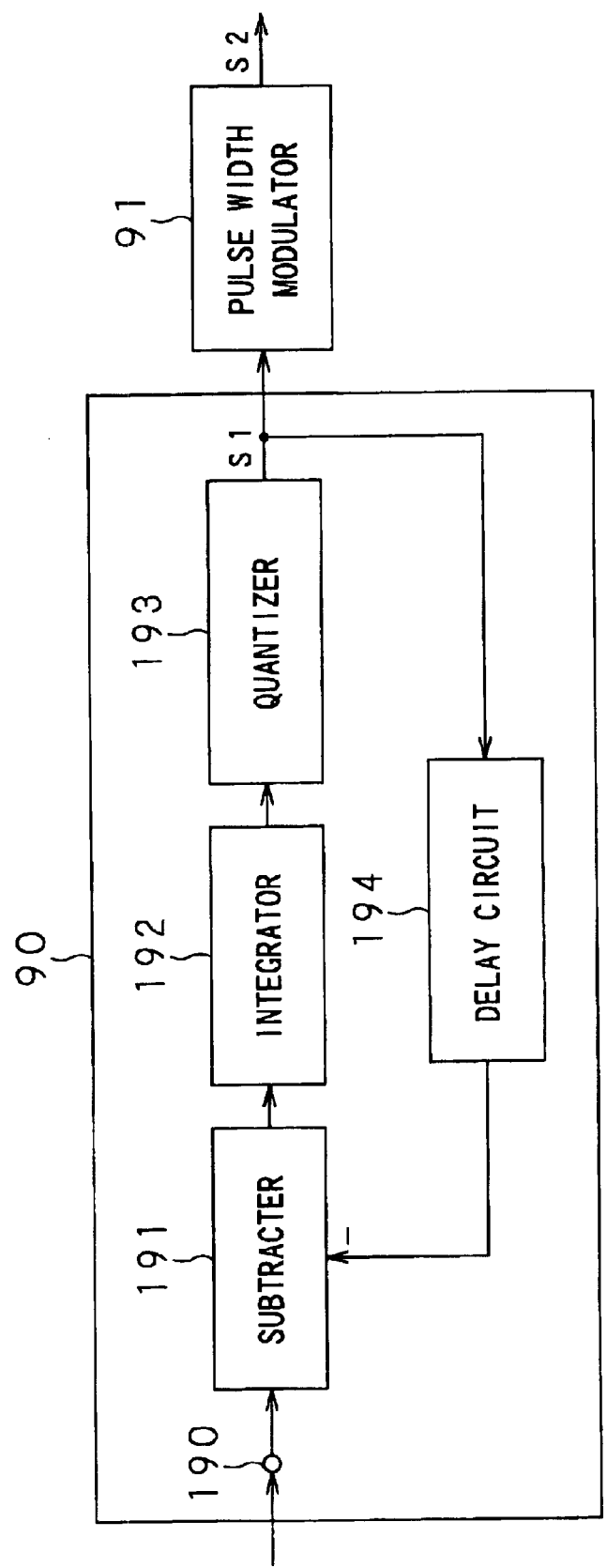
FIG. 2 is a block diagram of a delta-sigma modulator.
Figure 3:
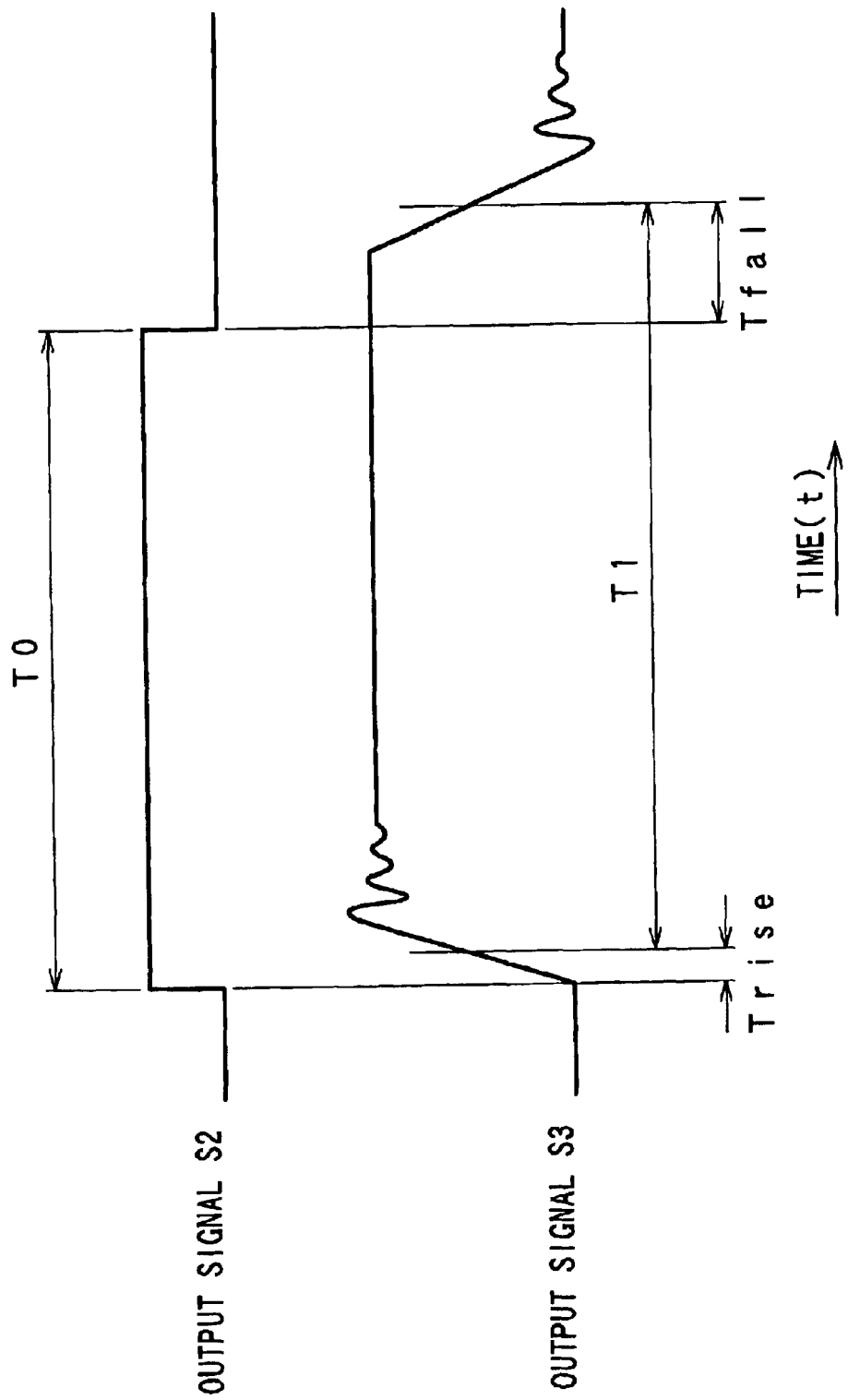
FIG. 3 is a view showing waveform of Pulse Width Modulated signal and signal amplified at switching module 12.

As shown in FIG. 5, the correction circuit 104 is composed of a converting circuit 105 and the correction table 106. The correction table 106 is a table such that in the case where pulse width T0 of pulse signal S2 and pulse width T1 of signal S3 are different from each other by distortion taking place at the switching module 12 or the LPF 13 as shown in FIG. 3 previously mentioned in modulating signal S1 quantized at the quantizer 103 into pulse signal S2 by the Pulse Width Modulator 11 to amplify the pulse signal S2 into a signal S3 of a predetermined magnitude by the switching module 12, the signal S1 is converted into signal S4 in which distortion taking place at the switching module 12 or the LPF 13 is taken into consideration so that pulse width T1 of the signal S3 results in pulse width T0.

An output signal S1 of the quantizer 103 is corrected into a signal S4 in accordance with the correction table 106 of the correction circuit 104, and is fed back to the input side. For example, as shown in FIG. 6, in the case where output signal S1 of the quantizer 103 is value $y_0$ corresponding to pulse width $t_0$ of an output signal S2 of the Pulse Width Modulator 11, output signal S4 of the correction circuit 104 is fed back to the input side as value $y_1$ corresponding to pulse width $t_1$ of signal S3 amplified so as to have a predetermined magnitude by the switching module 12. Namely, in the delta-sigma modulator 10, operation is carried out on the premise that value corresponding to pulse width $t_1$ is assumed to be outputted at the next operation of quantization noise while outputting value corresponding to pulse width $t_0$.

It is to be note that the correction circuit 104 serves to determine a predetermined output signal with respect to a certain input signal, and is realized by combinational logic circuit or memory. In the case where signal S1 is 6 bits, the correction table can be realized by memory of 64 words, and the converting circuit 105 may have a function to convert value of signal S1 into reference address of this memory. In the case where input signal is analog signal, this converting circuit 105 may be constituted by D/A converter.

Distortion may take place also by factor such as speaker 14 or the ambient temperature, etc. Since signal outputted from the switching module 12 also experiences influence of this distortion, the correction circuit 104 may comprises plural correction tables in which the condition such as speaker 14 or ambient temperature, etc. is taken into consideration to carry out switching between the correction tables in accordance with the used environment. FIG. 5 shows the configuration that a control signal SS is delivered from control unit (not shown) so that correction table is selected by that control signal SS.

Figure 7:
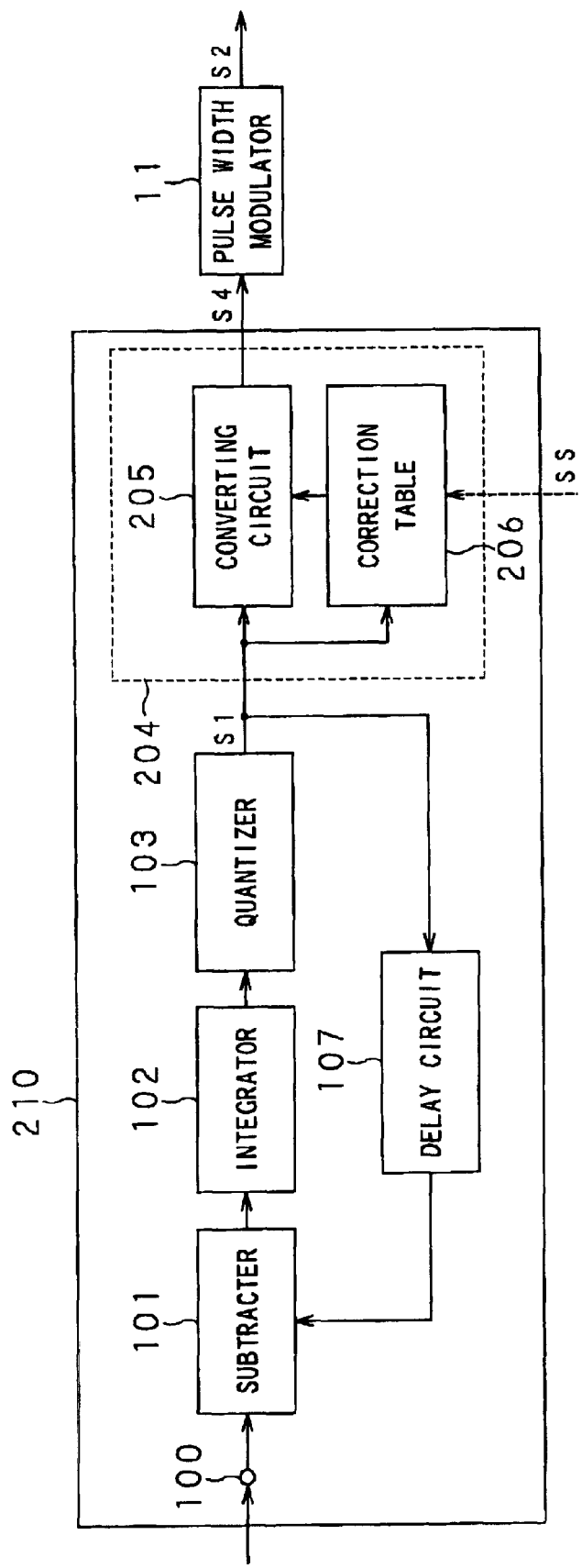
FIG. 7 is a block diagram of a second delta-sigma modulator that the class D power amplifier apparatus to which the present invention is applied has.

As another example, as shown in FIG. 7, a correction circuit 204 may be installed (provided) between quantizer 103 and Pulse Width Modulator 11. In this case, the portion constituted with subtracter 101, integrator 102, quantizer 103 and delay circuit 107 of a delta-sigma modulator 210 is the ordinary delta-sigma modulation circuit. A correction table 206 provided at the correction circuit 204 has the same configuration as the previously described correction table 106, but value of output signal S4 corresponding to output signal S1 is different. For example, in the case where output signal S1 of quantizer 103 is value $y_0$ corresponding to pulse width $t_0$ of output signal S2 of Pulse Width Modulator 11, output signal S4 of the correction circuit 204 is outputted as such a value that pulse width $t_1$ of signal S3 amplified by the switching module 12 so as to have a predetermined magnitude becomes equal to $t_0$. Namely, in the delta-sigma modulator 210, while the inside quantizer 103 is outputting value corresponding to pulse width to, output value is corrected by the correction circuit 204 so that pulse width of output signal S3 of the switching module 12 becomes equal to $t_0$ through Pulse Width Modulator 11 succeeding thereto. A converting circuit 205 functions similarly to the previously described converting circuit 105. Similarly, there may be also employed a configuration in which control signal SS is delivered from control unit (not shown) so that one of plural correction tables is selected by that control signal SS.

The class D power amplifier apparatus 1 constituted as described above installs (provides) correction circuit 104 or 204 in which distortion taking place at the switching module 12 or the LPF 13 is taken into consideration between the quantizer 103 and the delay circuit 107 of the delta-sigma modulator 10, or between the delta-sigma modulator 210 and the Pulse Width Modulator 11 to cancel, by the correction circuit 104 or 204, distortion taking place at the switching module 12 or the LPF 13 in which consideration is taken at the correction circuit in carrying out Pulse Width Modulation of signal outputted from the delta-sigma modulator 10 or 210 to amplify the Pulse Width Modulated signal by the switching module 12 so that there results a signal of a predetermined magnitude, thereby making it possible to prevent deterioration of the audio characteristic.

In the class D power amplifier apparatus 1, since influence of distortion taking place at the switching module 12, the LPF 13 and the speaker 14 is caused to undergo predictive control, there is no necessity of inserting detecting circuit, etc. which constitutes the cause of noise mixing between the switching module 12, the LPF 13 and the speaker 14. For this reason, it is possible to constitute the system with ease. In the class D power amplifier apparatus 1, since distortion of the switching module 12 is compensated by predictive control by digital signal processing, there is no influence by noise such as power supply ripple, etc. Further, because of the predictive control by the correction table, even in the case of correction at the time of large power output, it is possible to select in advance a value such that the delta-sigma modulator 10 or 210 does not oscillate.

While the example where the delta-sigma modulator of the first order is used has been described in the above-described first embodiment, delta-sigma modulator of higher order may be used. The present invention can be applied to delta-sigma modulator of the configuration to feed difference between input signal and output signal of the quantizer, i.e., quantization error back to the input side as in the case of examples described later, and it is sufficient to similarly carry out correction with respect to output signal or quantization error of the quantizer.

Then, explanation will be given in detail with reference to the attached drawings in connection with the second embodiment of the present invention.

Figure 8:
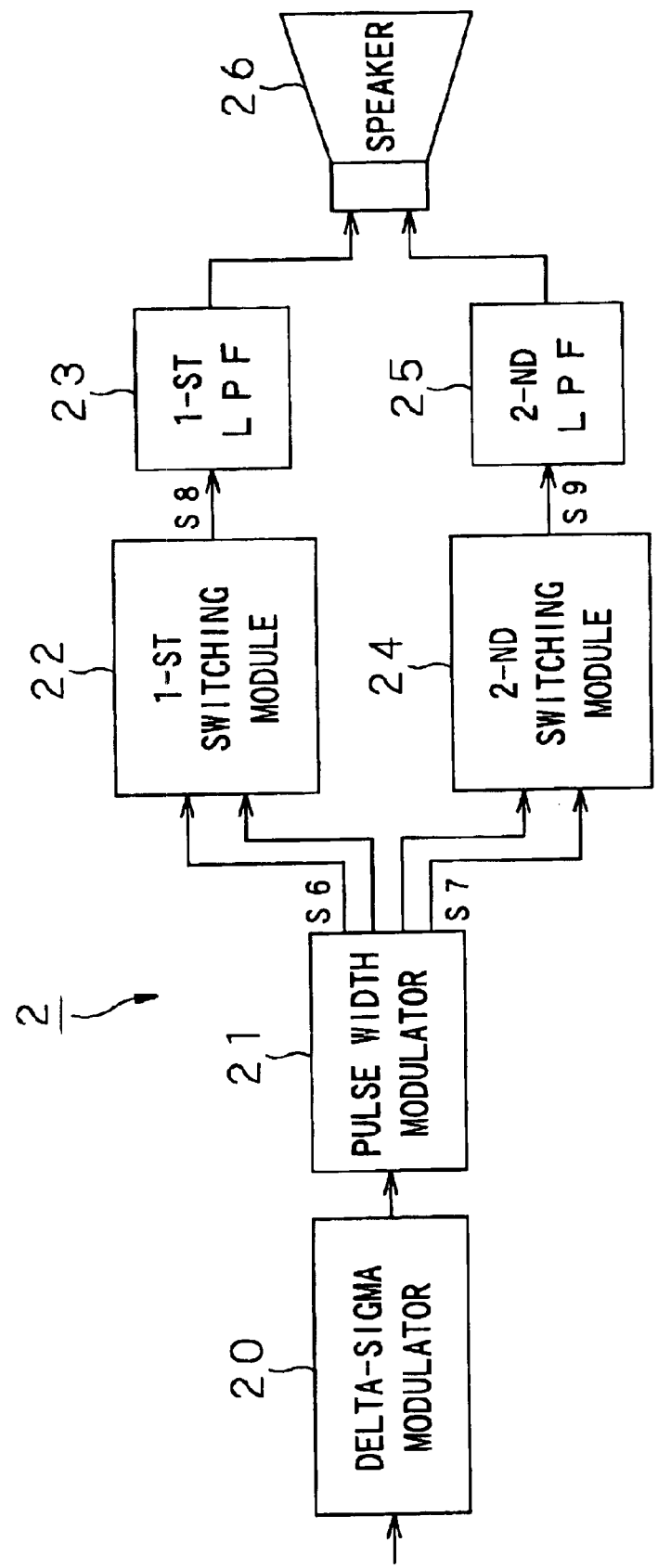
FIG. 8 is a block diagram of a class D power amplifier apparatus by BTL connection for amplifying audio signal to which the present invention is applied.

In this example, the present invention is applied to a class D power amplifier apparatus 2 by BTL (Bridge Tied Load) connection as shown in FIG. 8.

Here, connection form of the power amplifier will be explained. In the power amplifier, there are normal connection in which two channels are used by stereophonic mode and BTL connection in which two channels are used by monoral (monophonic) mode. In the BTL connection, signals inverted in phase are inputted to two amplifiers to synthsize them by speaker. Moreover, in the BTL connection, only +sides of speaker terminals are respectively used. By employing BTL connection, output signal is greatly increased so that sound quality is improved.

The class D power amplifier apparatus 2 by the BTL connection having the feature as described above comprises a delta-sigma modulator 20 for carrying out delta-sigma modulation of audio signal, a Pulse Width Modulator 21 for carrying out Pulse Width Modulation of the delta-sigma modulated signal, a first switching module 22 for amplifying the Pulse Width Modulated signal so that it has a predetermined magnitude, a first LPF 23 for carrying out filter processing with respect to the signal amplified so that it has the predetermined magnitude by the first switching module 22 to remove frequency component of the higher frequency band, a second switching module 24 for amplifying the Pulse Width Modulated signal so that it has a predetermined magnitude, and a second LPF 25 for carrying out filter processing with respect to the signal amplified so that it has the predetermined magnitude by the second switching module 24. The signals in which frequency component of the higher frequency band has been removed by the first LPF 23 and the second LPF 25 are delivered to a speaker 26, at which synthesis thereof is carried out.

Since the delta-sigma modulation method is the method which has been explained in the previously described first embodiment, further detailed explanation will be omitted.

Figure 9:
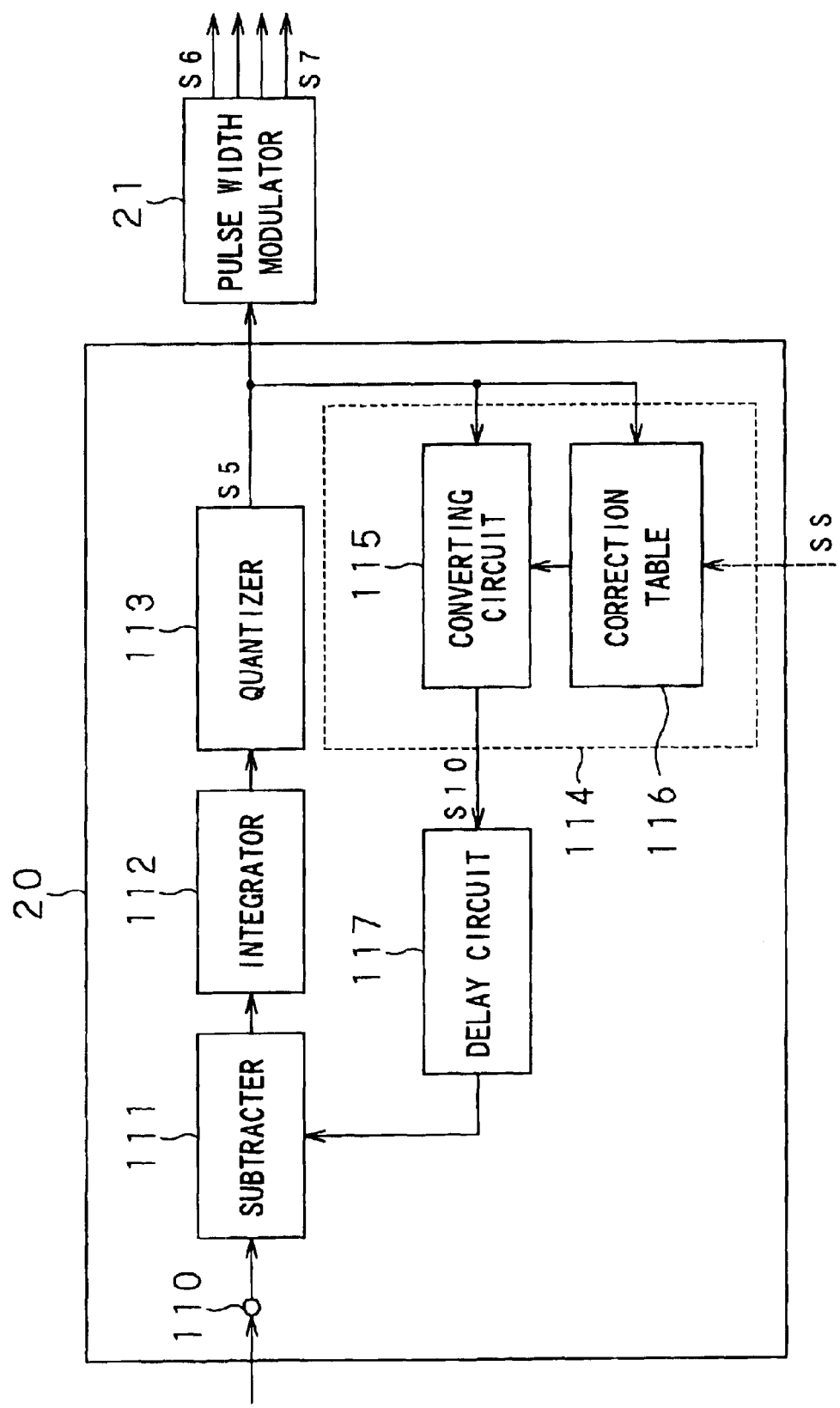
FIG. 9 is a block diagram of a first delta-sigma modulator that the class D amplifier apparatus by BTL connection to which the present invention is applied has.

The delta-sigma modulator 20 comprises, as shown in FIG. 9, an input terminal 110 supplied with an audio signal, a subtracter 111 for carrying out subtraction between audio signal and delay signal, an integrator 112 for integrating an output of the subtracter 111, a quantizer 113 for quantizing an output of the integrator 112 to output it, a correction circuit 114 within which correction table 116 which will be described later is included, and a delay circuit 117 for delaying an output signal of the correction circuit 114 by 1 clock (operating clock of the quantizer 113) to input it to the subtracter 111 as a delay signal.

Since the operations of the first switching module 22 and the second switching module 24 are similar to that of the switching module 12 which has been explained in the previously described first embodiment, further detailed explanation will be omitted.

Since the first switching module 22 and the second switching module 24 that the class D power amplifier apparatus 2 has are ordinarily operative at a higher power supply voltage as compared to input signal, distortion takes place in an output signal. Distortion takes place in an output signal from the influence of counter-electromotive force produced by coil also by the first LPF 23 and the second LPF 25. In the present invention, the correction circuit 114 including correction table 116 in which the characteristics of the first and second switching modules 22 and 24 and the first and second LPFs 23 and 25 which generate distortion are taken into consideration is installed (provided) at delta-sigma modulator 20 to thereby carry out such a correction to cancel in advance distortions of the first and second switching modules 22 and 24 and the first and second LPFs 23 and 25. The correction table that the correction circuit 114 has will be described below.

Figure 10:
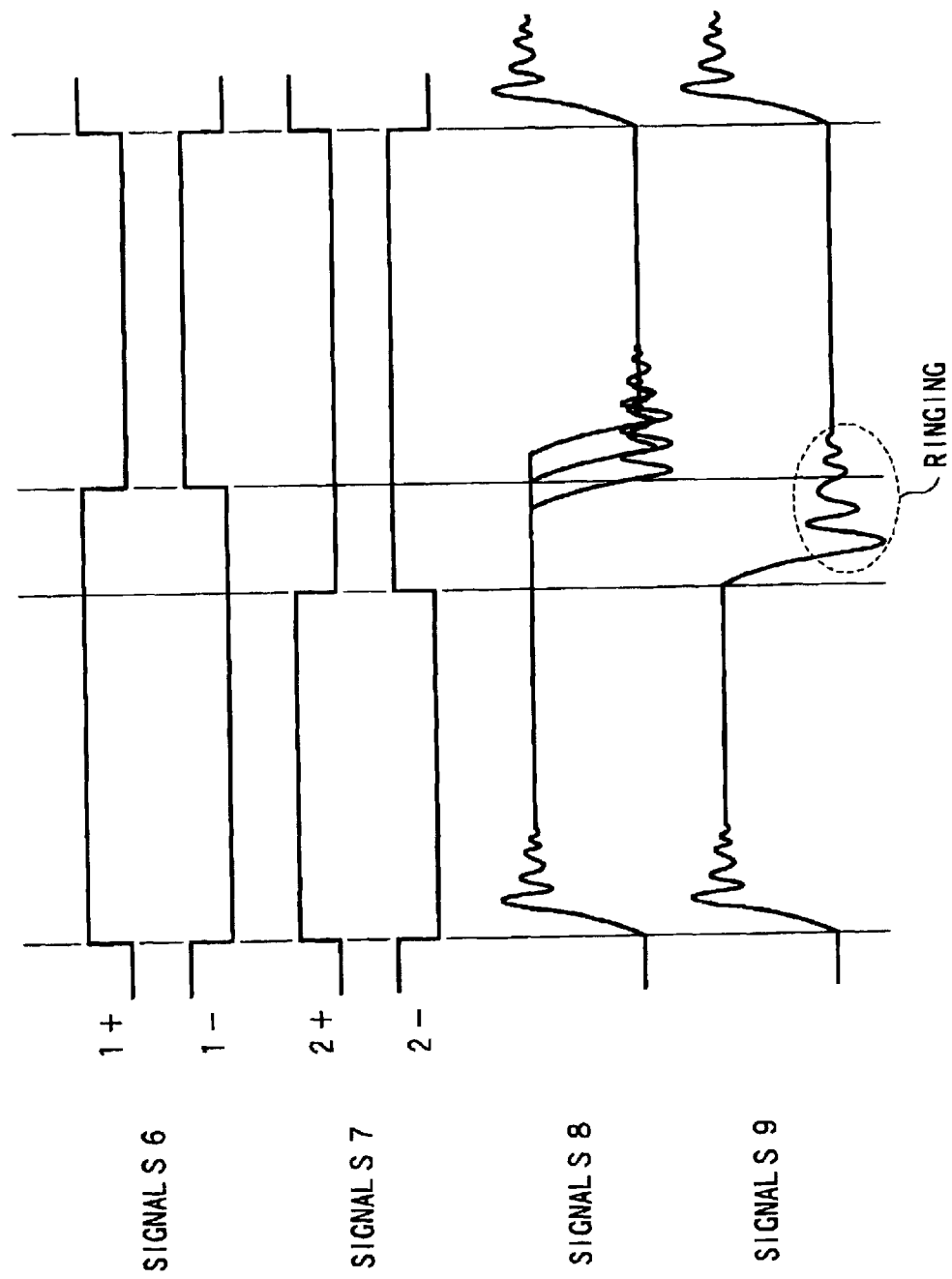
FIG. 10 is a view showing waveforms when first switching module experiences influence by ringing of second switching module.

In the case where, in modulating a signal S5 quantized at the quantizer 113 into a pulse signal S6 and a pulse signal S7 by the Pulse Width Modulator 21 to amplify the pulse signal S6 into a signal S8 of a predetermined magnitude by the first switching module 22 to amplify the pulse signal S7 into a signal S9 of a predetermined magnitude by the second switching module 24, e.g., ringing takes place in the signal S9 as shown in FIG. 10, the operation of the first switching module 22 is affected by this ringing. As a result, as shown in FIG. 10, falling timing is changed so that the pulse width is varied. As the cause that the pulse width differs from a desired value, in addition to the above, there of course also exists the fact that rising time $T_{rise}$ and falling time $T_{fall}$ in the respective switching modules which have been previously described with reference to FIG. 3 are respectively different from each other. In the configuration by the BTL connection, speaker 26 is driven by differential output by output signals S8 and S9 of the both switching modules. Even if distortion takes place in outputs of respective switching modules 22, 24, it is sufficient that distortion in the differential output between the switching module 22 and the switching module 24 can be resultantly corrected. In view of the above, the correction circuit 114 includes correction table 116 for converting signal S5 into signal S10 in which consideration is taken so that distortion does not take place by differential output between output signals S8 and S9 of these switching modules 22, 24. The correction circuit 114 serves to determine a predetermined output signal with respect to an input signal, and is realized by combinational circuit or memory. For example, in the case where output signal is 6 bits, the correction table can be realized by memory of 64 words, and converting circuit 115 may have a function to convert value of signal S5 into reference address of this memory. In the case where input signal is analog signal, this converting circuit 115 may be constituted by D/A converter.

Distortion may take place also by factor such as speaker 26 or ambient temperature, etc. Since signals outputted from the first and second switching modules 22 and 24 also undergo influence of this distortion, the correction circuit 114 may comprise plural correction tables in which the condition such as speaker 26 or ambient temperature, etc. is also taken into consideration to carry out switching between the correction tables in accordance with the used environment. FIG. 9 shows the configuration that control signal SS is delivered from control unit (not shown) so that correction table is selected by that control signal SS.

Figure 11:
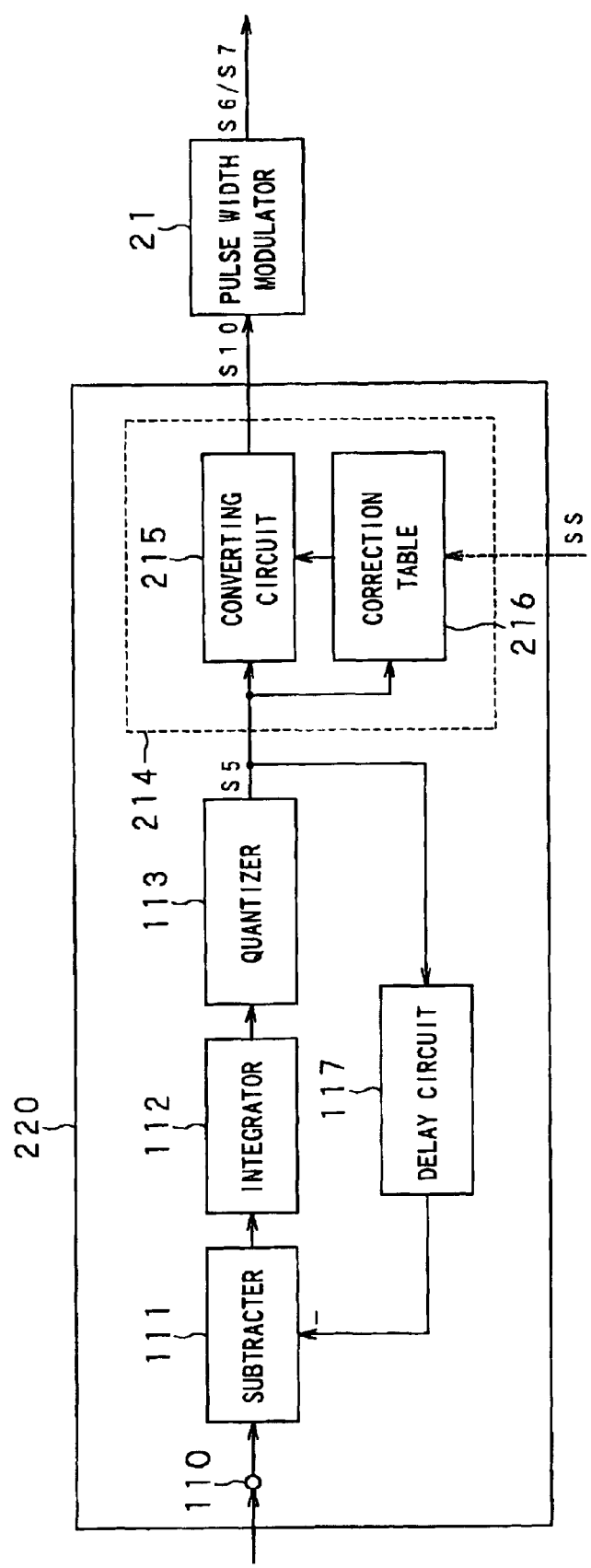
FIG. 11 is a block diagram of a second delta-sigma modulator that the class D amplifier apparatus by BTL connection to which the present invention is applied has.

As a further example, as shown in FIG. 11, a correction circuit 214 may be installed (provided) between quantizer 113 and Pulse Width Modulator 21. In this case, the portion constituted by subtracter 111, integrator 112, quantizer 113 and delay circuit 117 of a delta-sigma modulator 220 is the ordinary delta-sigma modulation circuit. A correction table 216 provided at the correction circuit 214 has the same configuration as that of the previously described correction table 116, but value of output signal S10 corresponding to output signal S5 is different. For example, in the case where output signal S5 of the quantizer 113 is value $y_0$ corresponding to differential output pulse width to between output signals S6 and S7 of the Pulse Width Modulator 21, output signal S10 of the correction circuit 214 is outputted as such a value $y_2$ that a differential output pulse width $t_1$ between signals S8, S9 amplified by the switching modules 22, 24 so that they have a predetermined magnitude becomes equal to $t_0$. Namely, the delta-sigma modulator 220 corrects output value by the correction circuit 214 so that while the inside quantizer 113 is outputting value corresponding to pulse width $t_0$, differential output pulse width between output signals S8, S9 of the switching modules 22, 24 becomes equal to $t_0$ through Pulse Width Modulator 21 succeeding thereto. A converting circuit 215 functions similarly to the previously described converting circuit 115. In addition, similarly, there may be employed a configuration such that control signal SS is delivered from control unit (not shown) so that one of plural correction tables is selected by that control signal SS.

The class D power amplifier apparatus 2 constituted as described above is adapted so that correction circuit 114 or 214 in which distortion taking place at the first and second switching modules 22 and 24 or the first and second LPFs 23 and 25 is taken into consideration is installed (provided) between quantizer 113 and delay circuit 117 of delta-sigma modulator 20 or between delta-sigma modulator 220 and Pulse Width Modulator 21 to cancel, by the correction circuit 114 or 214, distortion taking place at the first and second switching modules 22 and 24, or the first and second LPFs 23 and 25 in which consideration is taken in carrying out Pulse Width Modulation of signal outputted from delta-sigma modulator 20 or 220 by Pulse Width Modulator 21 to respectively amplify Pulse Width Modulated signals into signals of predetermined magnitudes by the first and second switching modules 22 and 24, thereby making it possible to prevent distortion of the audio characteristic.

In the class D power amplifier apparatus 2 of this example, since influence of distortion taking place at the first and second switching modules 22 and 24, the first and second LPFs 23 and 25, and speaker 26 is caused to undergo predictive control, there is no necessity of inserting detecting circuit, etc. which constitutes the cause of noise mixing between the first and second switching modules 22 and 24, the first and second LPFs 23 and 25, and the speaker 26. For this reason, it is possible to easily constitute the system. In the class D power amplifier apparatus 2, since distortion of the first and second switching modules 22 and 24 is compensated by predictive control by digital signal processing, influence by noise such as power supply ripple, etc. does not exist. Further, because of predictive control by the correction table, even in the case of correction at the time of large power output, it is possible to select in advance a value such that the delta-sigma modulator 20 or 220 does not oscillate.

While the example where delta-sigma modulator of first order has been described in the above-described second embodiment of the present invention, delta-sigma modulator of higher order may be used. The present invention can be applied also to a delta-sigma modulator of the configuration to feed difference between input signal and output signal of the quantizer, i.e., quantization error back to the input side as in the case of the example described later.

Then, explanation will be given in detail with reference to the attached drawings in connection with the third embodiment of the present invention. It is to be noted that the same reference numerals are respectively attached to functional blocks having functions similar to those of the functional blocks which have been explained in the previously described embodiments, and detailed explanation will be omitted.

Figure 12:
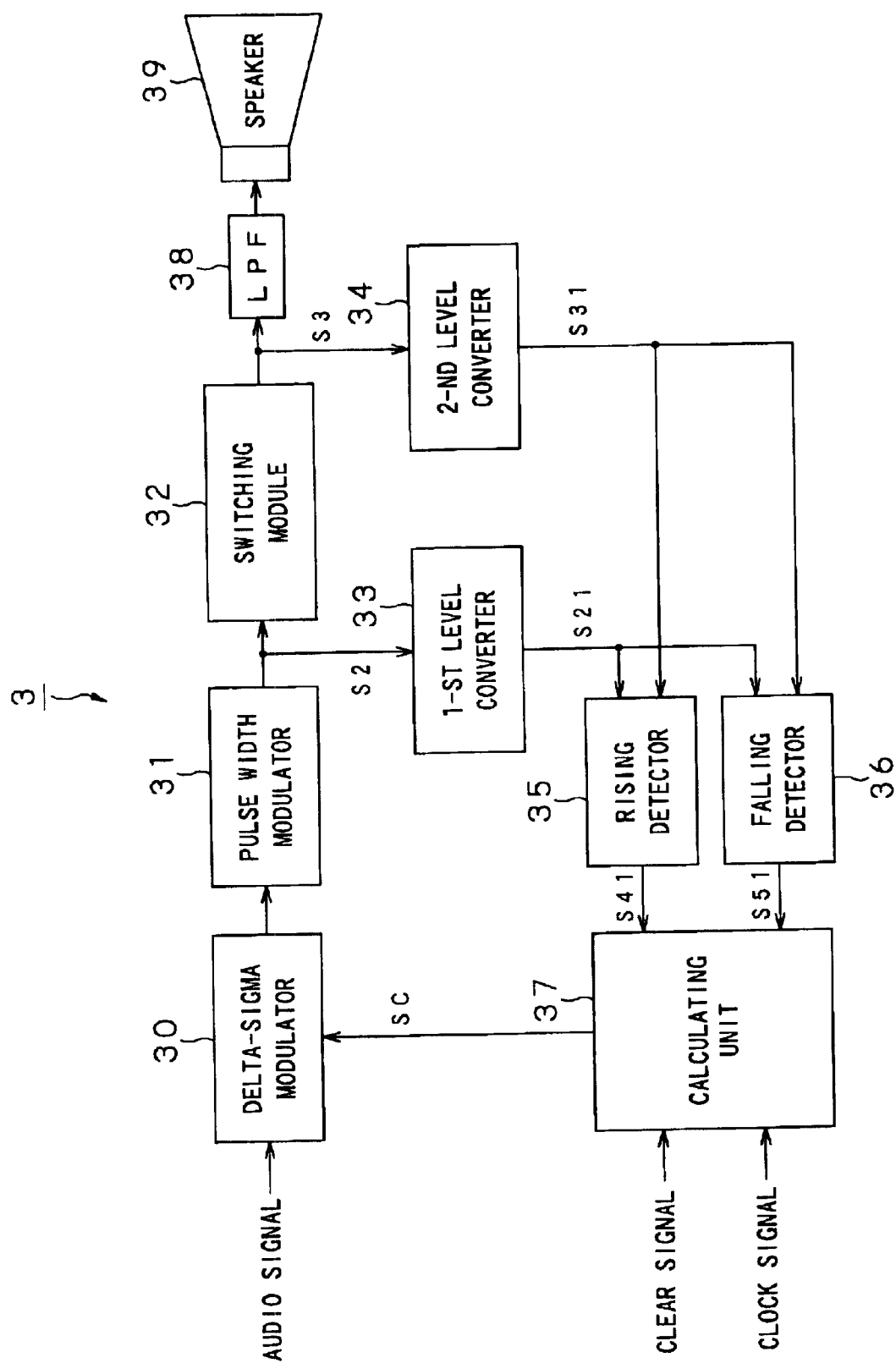
FIG. 12 is a block diagram of a class D power amplifier apparatus for amplifying audio signal to which the present invention is applied.

The present invention is applied to, e.g., a class D power amplifier apparatus 3 as shown in FIG. 12.

The class D power amplifier apparatus 3 comprises a delta-sigma modulator 30 for carrying out delta-sigma modulation of an audio signal, a Pulse Width Modulator 31 for carrying out Pulse Width Modulation of the delta-sigma modulated signal, a switching module 32 for amplifying the Pulse Width Modulated signal S2 into a signal S3 of a predtermined magnitude, a first level converter 33 for converting the Pulse Width Modulated signal S2 into a voltage of a predetermined magnitude, a second level converter 34 for converting signal S3 amplified by the switching module 32 so that it has the predetermined magnitude into a voltage of a predetermined magnitude, a rising detector 35 for detecting time difference of the rising portion from output signal S21 of the first level converter 33 and output signal S31 of the second level converter 34, a falling detector 36 for detecting time difference of the falling portion from output signal S21 of the first level converter 33 and output signal S31 of the second level converter 34, a calculating unit 37 for calculating distortion quantity from output signal S41 of the rising detector 35 and output signal S51 of the falling detector 36, and a LPF 38 for carrying out filter processing with respect to signal S3 amplified by the switching module 32 so that it has a predetermined magnitude to remove frequency component of the higher frequency band. The signal from which the frequency component of the high frequency band has been removed by the LPF 38 is delivered to a speaker 39. Thus, audio signal of the audible frequency band is reproduced.

Figure 13:
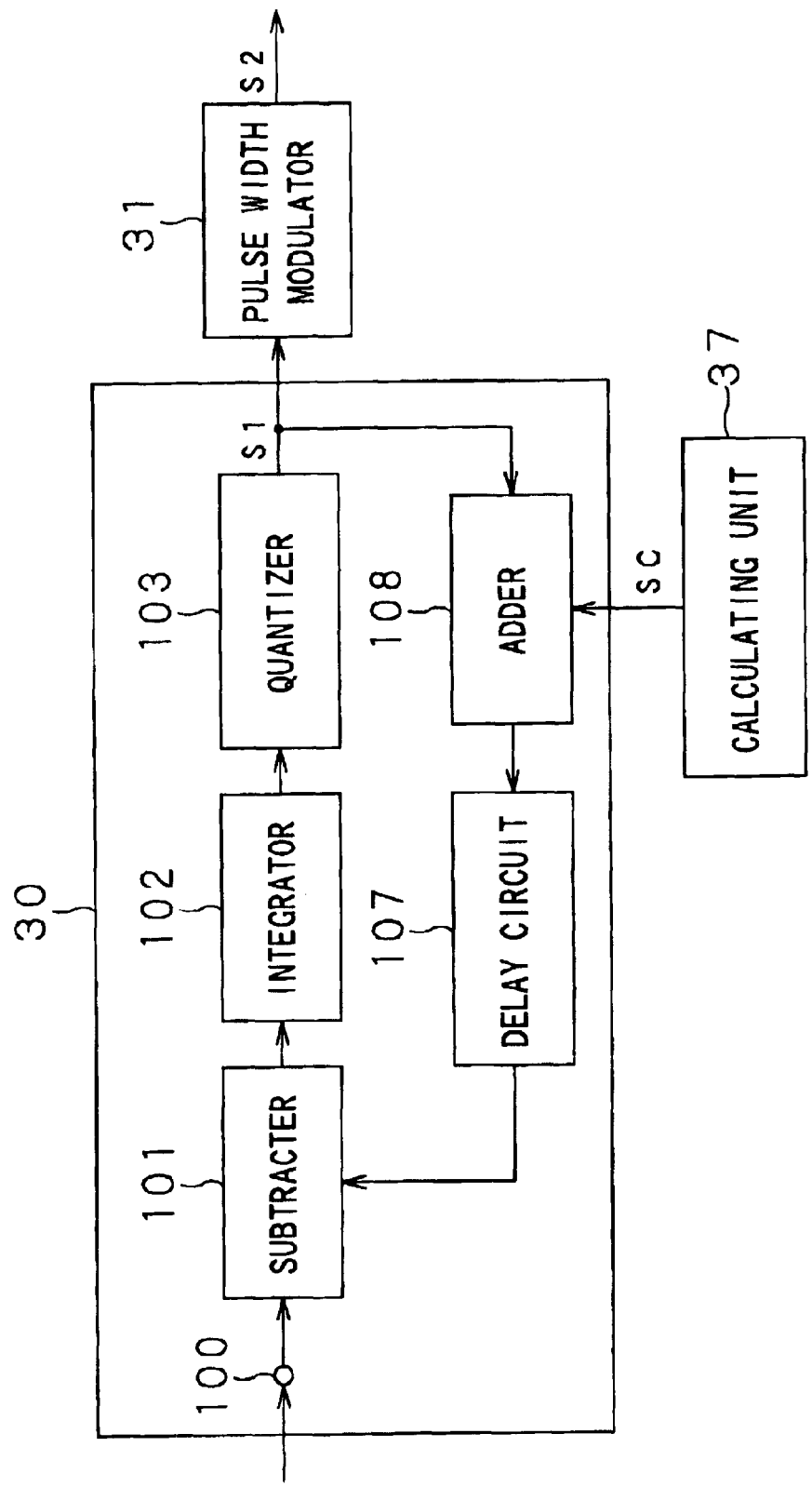
FIG. 13 is a block diagram of a third delta-sigma modulator that the class D power amplifier apparatus to which the present invention is applied has.

The delta-sigma modulator 30 which carries out delta-sigma modulation with respect to signal by the delta-sigma modulation method comprises, as shown in FIG. 13, an input terminal 100 supplied with an audio signal, a subtracter 101 for carrying out subtraction between audio signal and delay signal, an integrator 102 for integrating an output of the subtacter 101, a quantizer 103 for quantizing an output of the integrator 102 to output it, an adder 108 for adding output signal S1 of the quantizer 103 and output signal SC of the calculating unit 37, and a delay circuit 107 for delaying output signal of the adder 108 by 1 clock (operating clock of the quantizer 103) to input it to the subtracter 101 as a delay signal. It is to be noted that in the case where there is a need to convert output signal SC of the calculating unit 37 into a suitable value with respect to output signal of the quantizer 103, correction circuit which corrects output signal SC of the calculating unit 37 so that it is changed into a suitable value with respect to output signal of the quantizer 103 is assumed to be installed (provided) between the calculating unit 37 and the adder 108.

Figure 14:
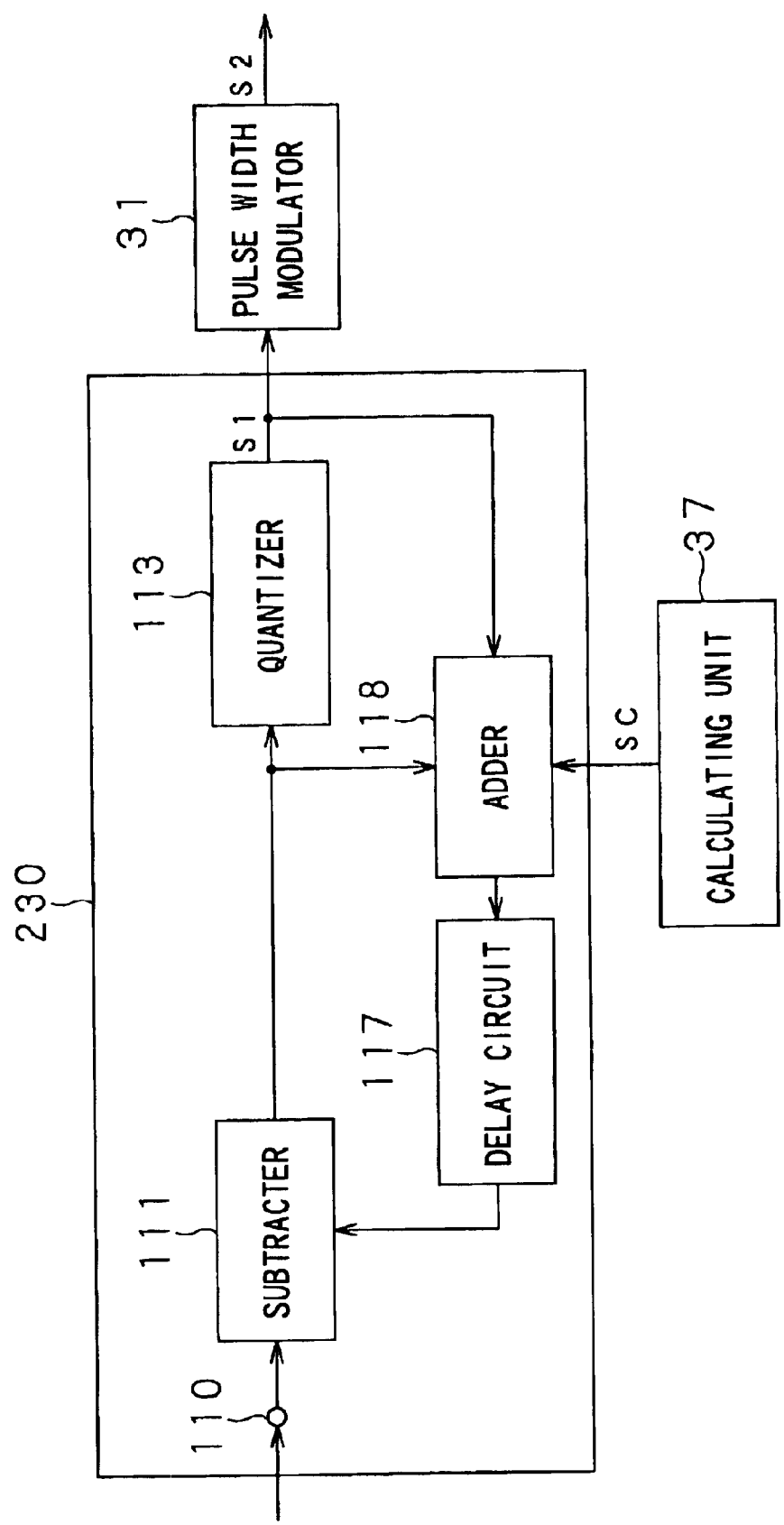
FIG. 14 is a block diagram of a fourth delta-sigma modulator that the class D power amplifier apparatus to which the present invention is applied has.

As a still further example, as shown in FIG. 14, a delta-sigma modulator 230 may be caused to be of the configuration comprising an input terminal 110 supplied with an audio signal, a subtacter 111 for carrying out subtraction between audio signal and delay signal, a quantizer 113 for quantizing an output of the subtracter 111, an adder 118 for carrying out addition and/or subtraction of output signal of the subtracter 111, output signal of the quantizer 113, and output signal of the calculating unit 37, and a delay circuit 117 for delaying output signal of the adder 118 by 1 clock (operating clock of the quantizer 113)

to input it to the subtracter 111 as a delay signal. In this adder 118, there is conducted such an operation to carry out correction by output signal SC of the calculating unit 37 with respect to difference between input signal and output signal of the quantizer 113, i.e., quantization error to output it to the delay circuit 117. It is to be noted that in the case where there is a need of converting output signal SC of the calculating unit 37 into a suitable value with respect to output signal of the quantizer 113, a correction circuit which corrects output signal SC of the calculating unit 37 so that it has a suitable value with respect to output signal of the quantizer 113 is provided between the calculating unit 37 and the adder 118.

The switching module 32 is an amplifier for amplifying signal by the switching operation similarly to the previously described switching module 12 shown in FIG. 4. Since the switching module 32 is ordinarily operative at a higher power supply voltage as compared to input signal, distortion takes place in an output signal. Further, it is considered that the fact that rising time $T_{rise}$ and falling time $T_{fall}$ at the switching module are different as explained with reference to FIG. 3 also constitutes the caause that the pulse width differs from a desired value. Distortion takes place also by the factor such as LPF 38, speaker 39 and the ambient temperature, etc. In the class D power amplifier 3, difference of pulse width is detected from pulse width of output signal S2 of the Pulse Width Modulator 31 and pulse width of output signal S3 of the switching module 32 distorted by the above-described cause to feed the correction signal SC in which the above-described difference of pulse width taking place by the characteristic such as switching module 32, LPF 38, speaker 39 and the ambient temperature, etc. is taken into consideration back to the delta-sigma modulator 30 to carry out correction to make cancellation in carrying out amplification at the switching module 32.

Figure 15:
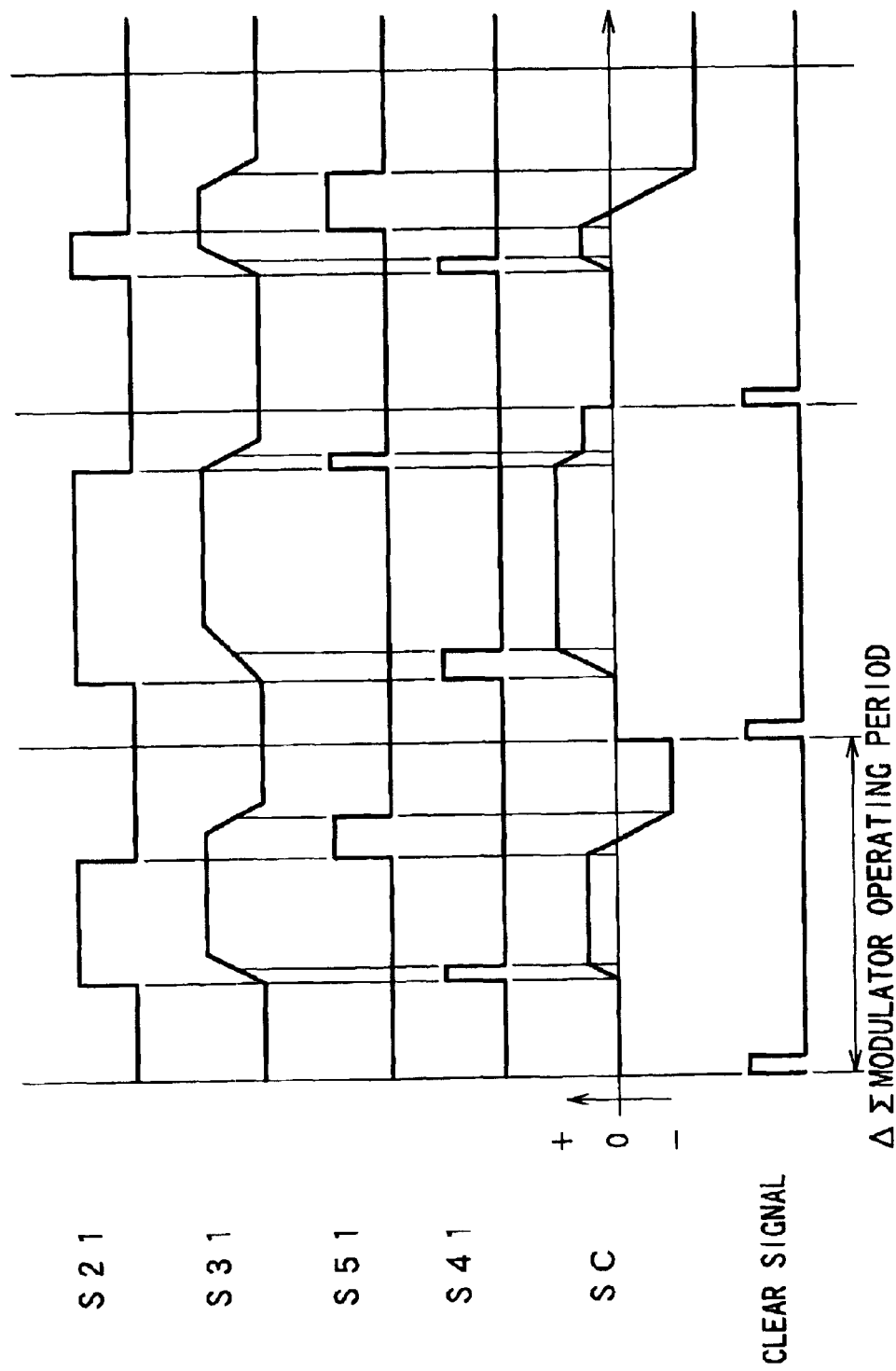
FIG. 15 is a view showing waveform of Pulse Width Modulated signal, waveform of signal amplified by switching module waveform generated by difference of rising component, waveform generated by difference of falling component, counter output waveform, and waveform of clear signal.

The operation of the feedback will be described below with reference to FIG. 15.

The first level converter 33 converts output signal S2 of the Pulse Width Modulator 31 into signal S21 adapted to the rising detector 35 and the falling detector 36. The second level converter 34 converts output signal S3 of the switching module 32 into signal S31 adapted to the rising detector 35 and the falling detector 36. The rising detector 35 compares the rising time point of signal S21 and the falling time point of signal S31 to detect that difference (time difference). As shown in FIG. 15, the rising detector 35 generates signal S41 from the detected difference to deliver it to the calculating unit 37. Moreover, the falling detector 36 compares falling time point of signal S21 and falling time point of signal S31 to detect that difference (time difference). The falling detector 36 generates signal S51 from the detected difference to deliver it to the calculating unit 37. The calculating unit 37 generates counter signal SC on the basis of a predetermined clock signal from signal S41 delivered from the rising detector 35 and signal S51 delivered from the falling detector 36. The counter signal SC indicates value corresponding to distortion quantity taking place by the characteristic of the switching module 32 and the LPF 38, etc. The calculating unit 37 delivers counter signal SC to adder 108 of the delta-sigma modulator 30 or adder 118 as a correction signal. It is to be noted that in the case where clear signal shown in FIG. 15 is detected, a work for returning the counter signal SC to zero is carried out. The timing at which the clear signal is outputted is caused to be the same as the operating period of the delta-sigma modulator 30.

The class D power amplifier apparatus 3 constituted in this way feeds distortion quantity taking place by the characteristic of switching module 32, LPF 38 and speaker 39, etc. back to adder 108 of the delta-sigma modulator 30 or adder 118 through the first level converter 33, the second level converter 34, the rising detector 35, the falling detector 36 and the calculating unit 37 to cancel distortion quantity taking place by the characteristic of switching module 32, LPF 38 and speaker 39, etc. inputted by feedback in carrying out Pulse Width Modulation of signal outputted from the delta-sigma modulator 30 by the Pulse Width Modulator 31 to amplify the Pulse Width Modulated signal into a signal of a predetermined magnitude by the switching module 32, thereby making it possible to prevent deterioration of the audio characteristic without lowering S/N ratio of the delta-sigma modulation processing.

It is to be noted that the rising detector 35 and the falling detector 36 can directly process output signal S2 of the Pulse Width Modulator 31 and output signal S3 of the switching module 32, the first and second level converters 33 and 34 become unnecessary, and a delay circuit may be installed (provided) at the positions of the first and second level converters 33 and 34 to realize timing between signal S2 and signal S3.

While the example where delta-sigma modulator of the first order is used has been described in the above-described third embodiment, delta-sigma modulator of higer order may be used.

Then, explanation will be given in detail with reference to the attached drawings in connection with the fourth embodiment of the present invention.

Figure 16:
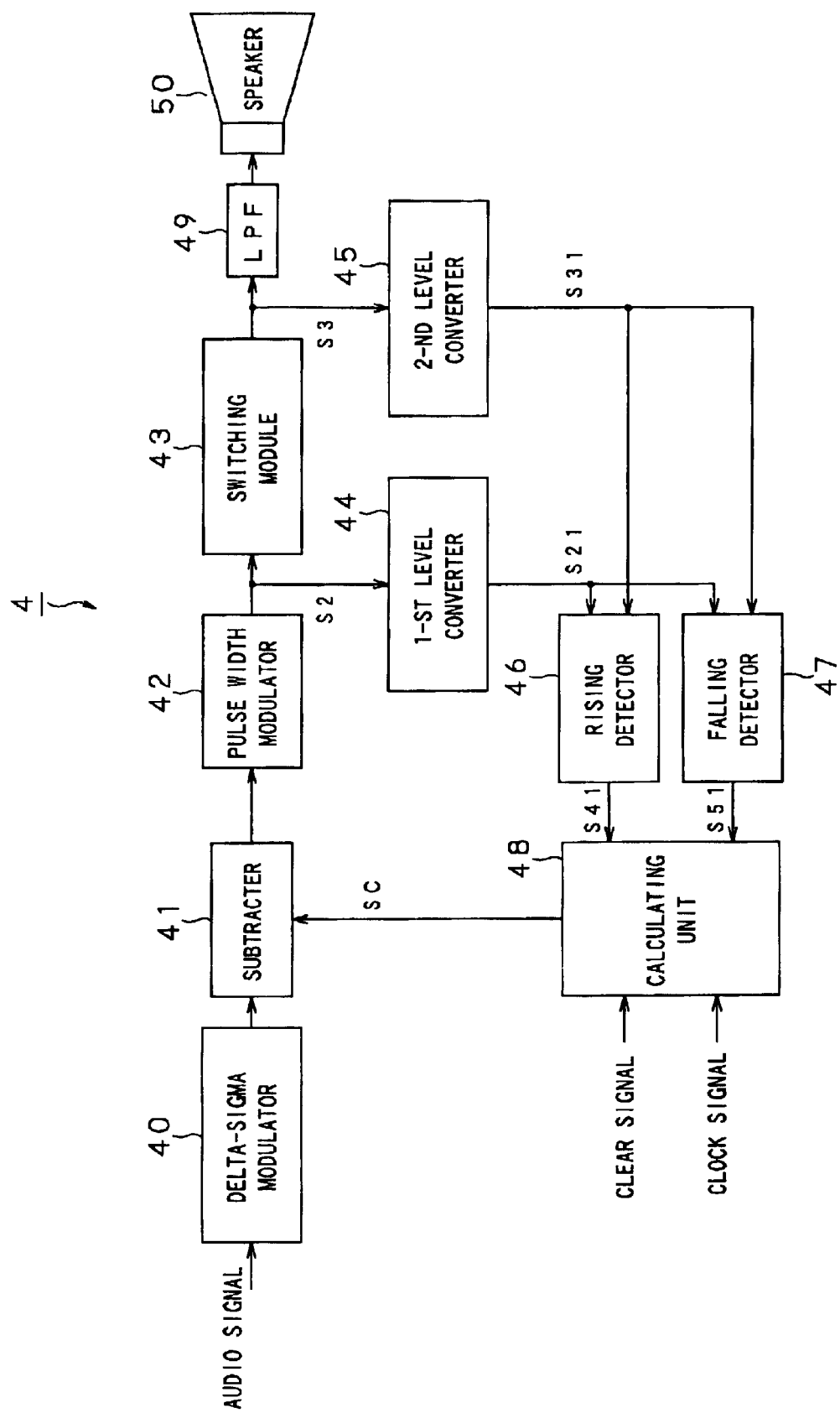
FIG. 16 is a block diagram of a class D power amplifier apparatus for amplifying audio signal to which the present invention is applied.

In this example, the present invention is applied to a class D power amplifier apparatus 4 as shown in FIG. 16.

The class D power amplifier apparatus 4 comprises a delta-sigma modulator 40 for carrying out delta-sigma modulation of audio signal, a subtracter 41 for carrying out subtraction between the delta-sigma modulated signal and output signal SC of a calculating unit 48, a Pulse Width Modulator 42 for carrying out Pulse Width Modulation of output signal of the subtracter 41, a switching module 43 for amplifying the Pulse Width Modulated signal S2 into a signal S3 of a predetermined magnitude, a first level converter 44 for converting the Pulse Width Modulated signal S2 into a voltage of a predetermined magnitude, a second level converter 45 for converting the signal S3 amplified by the switching module 43 so that it has a predetermined magnitude into a voltage of a predetermined magnitude, a rising detector 46 for detecting difference (time difference) between respective rising time points from output signal S21 of the first level converter 44 and output signal S31 of the second level converter 45, a falling detector 47 for detecting difference (time difference) between respective falling time points from output signal S21 of the first level converter 44 and output signal S31 of the second level converter 45, calculating unit 48 for calculating value corresponding to distortion quantity from output signal S41 of the rising detector 46 and output signal S51 of the falling detector 47, and a LPF 49 for carrying out filter processing with respect to signal S3 amplified by the switching module 43 so that it has a predetermined magnitude to remove frequency component of the higher frequency band. In addition, signal in which the frequency component of the high frequency band has been removed by the LPF 49 is delivered to a speaker 50. Thus, an audio signal of the audible band is reproduced.

Since the delta-sigma modulation method is the method as explained in the previously described first embodiment, detailed explanation will be omitted.

Figure 17:
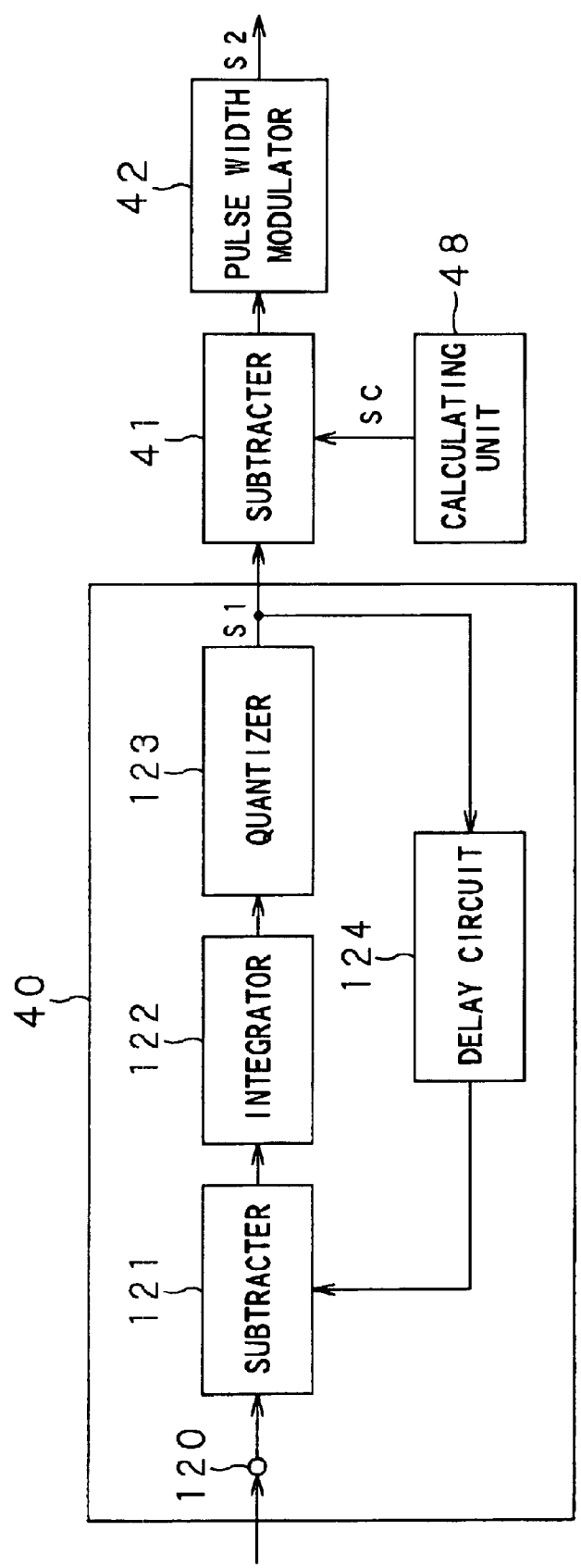
FIG. 17 is a block diagram of a fifth delta-sigma modulator that the class D power amplifier to which the present invention is applied has.

A delta-sigma modulator 40 comprises, as shown in FIG. 17, an input terminal 120 supplied with an audio signal, a subtracter 121 for carrying out subtraction between audio signal and delay signal, an integrator 122 for integrating an output of the subtracter 121, a quantizer 123 for quantizing an output of the integrator 122 to output it, and a delay circuit 124 for delaying output signal S1 of the quantizer 123 by 1 clock (operating clock of the quantizer 123) to input it to the subtracter 121 as a delay signal. Output signal S1 of the quantizer 123 is delivered to subtracter 41.

It is to be noted that in the case where there is a need of converting output signal SC of the calculating unit 48 into a suitable value with respect to output signal of the quantizer 123, a correction circuit which corrects output signal SC of the calculating unit 48 into a suitable value with respect to an output signal of the quantizer 123 is installed (provided) between the calculating unit 48 and the subtracter 41.

Figure 18:
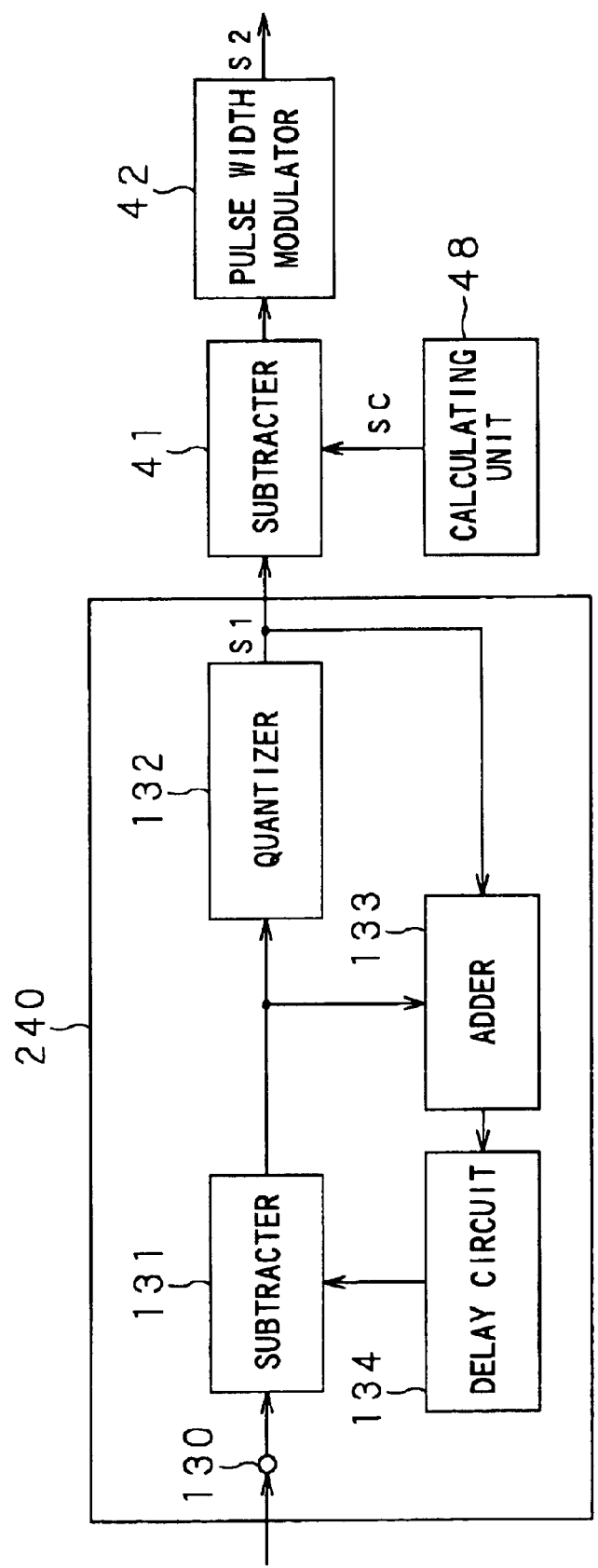
FIG. 18 is a block diagram of a sixth delta-sigma modulator that the class D power amplifier to which the present invention is applied has.

As a still more further example, as shown in FIG. 18, a delta-sigma modulator 240 may be caused to be of the configuration comprising an input terminal 130 supplied with an audio signal, a subtracter 131 for carrying out subtraction between audio signal and delay signal, a quantizwe 132 for quantizing an output of the subtracter 131, an adder 133 for adding output signal of the subtracter 131 and output signal of the quantizer 132, and a delay circuit 134 for delaying output signal of the adder 133 by 1 clock (operating clock of the quantizer 132) to input it to the subtracter 131 as a delay signal.

Also in this example, in the case where there is a need of converting output signal SC of the calculating unit 48 into a suitable value with respect to an output signal of the quantizer 132, a correction circuit which corrects output signal SC of the calculating unit 48 into a suitable value with respect to an output signal of the quantizer 132 is installed (provided) between the calculating unit 48 and the subtracter 41.

Since the operation of the switching module 43 is similar to the operation of the switching module 12 explained in the previously described first embodiment, detailed explanation will be omitted.

Since the switching module 43 that the class D power amplifier apparatus 4 has is ordinarily operative at a higher power supply voltage as compared to input signal, distortion takes place in an output signal. Further, it is considered that the fact that rising time $T_{rise}$ and falling time $T_{fall}$ in the switching module are different from each other as explained with reference to FIG. 3 also constitutes the cause that pulse width differs from a desired value. Distortion takes place also by the factor such as LPF 49, speaker 50 and ambient temperature, etc. In the calss D power amplifier 4, difference (time difference) between those pulse widths is detected from pulse width of output signal S2 of Pulse Width Modulator 42 and pulse width of output signal S3 of the switching module 43 distorted by the above-described factor to feed correction signal SC in which difference of the above-described pulse width taking place by the charcteristic of switching module 43 and LPF 49, etc. is taken into consideration back to the delta-sigma modulator 40 to carry out correction which makes cancellation in carrying out amplification at the switching module 43. The operation of the feedback will be described below.

The first level converter 44 converts output signal S2 of Pulse Width Modulator 42 into a signal S21 adapted to rising detector 46 and falling detector 47. The second level converter 45 converts output signal S3 of switching module 43 into signal S31 adapted to rising detector 46 and falling detector 47. The rising detector 46 compares rising time point of signal S21 and falling time point of signal S31 to detect that difference (time difference). The rising detector 46 generates signal S41 from the detected difference to deliver it to the calculating unit 48. Moreover, the falling detector 47 compares falling time point of signal S21 and falling time point of signal S31 to detect that difference (time difference). The falling detector 47 generates signal S51 from the detected difference to deliver it to the calculating unit 48. The calculating unit 48 generates counter signal SC on the basis of a predetermined clock signal from the signals S41 and S51 which have been delivered. The counter signal SC indicates value corresponding to distortion quantity taking place by the charcteristic of switching module 43 and LPF 49, etc. The calculating unit 48 delivers the counter signal SC to the subtracter 41 as a correction signal. It is to be noted that in the case where the calculating unit 48 detects clear signal, it carries out a work which returns counter signal SC to zero. The timing at which clear signal is outputted is caused to be the same as the operating period of the delta-sigma modulator 40.

The class D power amplifier apparatus 4 constituted in this way serves to feed distortion quantity taking place by switching module 43 and LPF 49, etc. back to the subtracter 41 through first level converter 44, second level converter 45, rising detector 46, falling detector 47 and calculating unit 48 to cancel distortion quantity taking place at the switching module 43 or the LPF 49, etc. which has been inputted by feedback in carrying out Pulse Width Modulation of signal outputted from the subtracter 41 by the Pulse Width Modulator 42 to amplify the Pulse Width Modulated signal by the switching module 43 so that there results a signal of a predetermined magnitude, thereby making it possible to prevent deterioration of the audio characteristic without lowering S/N ratio of the delta-sigma modulation processing.

In the case where the rising detector 46 and the falling detector 47 can directly process output signal S2 of the Pulse Width Modulator 42 and output signal of the switching module 43, the first and second level converters 44 and 45 become unnecessary. Further, delay circuits may be installed (provided) at the positions of the first and second level converters 44 and 45 to realize timing between signal S2 and signal S3.

While the example where delta-sigma modulator of first order is used has been described in the above-described fourth embodiment, delta-sigma modulator of higher order may be also used.

INDUSTRIAL APPLICABILITY

As explained in detail above, in the delta-sigma modulation device according to the present invention, correction circuit including correction table in which the characteristics of the amplifier and/or filter are taken into consideration is provided between the quantizer and the delay circuit of the delta-sigma modulator, or between the delta-sigma modulator and the pulse width modulator to thereby cancel, by the correction circuit, distortion taking place at the amplifier and/or filter in which consideration is taken in amplifying signal modulated by the delta-sigma modulator and the pulse width modulator by the amplifier so that a signal of a predetermined magnitude is provided to have ability to prevent deterioration of the audio characteristic.

In the signal amplifier apparatus according to the present invention, there is employed such an approach to detect distortion taking place by the characteristic of circuit or circuits connected to the succeeding stage from the pulse width modulator from difference between input signal and output signal of the amplifier to feed the detected distortion quantity back to the delta-sigma modulator or the subtracter to cancel distortion quantity which has been fed back in amplifying signal modulated by the delta-sigma modulator and the pulse width modulator by the amplifier so that a signal of a predetermined magnitude is provided. Accordingly, it is possible to prevent deterioration of the audio characteristic without lowering S/N ratio of the delta-sigma modulation processing.

What is claimed is:

1. A delta-sigma modulation device including a quantizer in which an output of the quantizer is fed back to the input side of the device as a feedback signal, the delta-sigma modulation device comprising:

a correction circuit for correcting the output including a quantization error of the quantizer, so that a corrected value constitutes the feedback signal, wherein distortion taking place in circuits connected to a succeeding stage of the delta-sigma modulation device is corrected by the correction circuit, wherein the circuits connected to a succeeding stage include a pulse width modulator producing a pulse width modulation signal fed to an amplifier, and wherein the correction circuit includes detecting means for detecting a distortion quantity in the amplifier and producing the corrected value corresponding thereto, and wherein the detecting means includes:

rising detecting means for detecting a rising time difference between a rising time point of the pulse width modulation signal and a rising time point of an output signal of the amplifier, falling detecting means for detecting a falling time difference between a falling time point of the pulse width modulated signal and a falling time point of the output signal of the amplifier, calculating means for calculating the distortion quantity in the amplifier from the rising time difference and the falling time difference, and a delay provided at an input side of one of the rising detecting means and the falling detecting means and serving to match a timing between the pulse width modulated signal and the output signal of the amplifier.

2. The delta-sigma modulation device as set forth in claim 1, wherein the correction circuit comprises a correction table in which the output of the quantizer and a correction output are stored in a manner associated with each other to output, as the feedback signal, the correction output corresponding to the output of the quantizer that has been delivered thereto.

3. The delta-sigma modulation device as set forth in claim 2, wherein the correction circuit comprises a plurality of the correction tables, whereby when a select control signal is delivered thereto one of the plurality of correction tables is selected to output the correction output based on the selected correction table.

4. A delta-sigma modulation device including a quantizer in which an output including a quantization error of the quantizer is fed back to the input side of the device as a feedback signal, the delta-sigma modulation device comprising:

a correction circuit for correcting the output signal of the quantizer that is fed to a circuit connected to a succeeding stage of the delta-sigma modulation device, wherein distortion taking place in circuits of the succeeding stage is corrected by the correction circuit, wherein the circuits connected to a succeeding stage include a pulse width modulator producing a pulse width modulation signal fed to an amplifier, and wherein the correction circuit includes detecting means for detecting a distortion quantity in the amplifier and producing the corrected value corresponding thereto, and wherein the detecting means includes:

rising detecting means for detecting a rising time difference between a rising time point of the pulse width modulation signal and a rising time point of an output signal of the amplifier, falling detecting means for detecting a falling time difference between a falling time point of the pulse width modulated signal and a falling time point of the output signal of the amplifier, calculating means for calculating the distortion quantity in the amplifier from the rising time difference and the falling time difference, and a delay provided at an input side of one of the rising detecting means and the falling detecting means and serving to match a timing between the pulse width modulated signal and the output signal of the amplifier.

5. The delta-sigma modulation device as set forth in claim 4, wherein the correction circuit comprises a correction table in which the output of the quantizer and a correction output are stored in a manner associated with each other to output the correction output corresponding to the output of the quantizer fed thereto to the circuit or circuits of the succeeding stage.

6. The delta-sigma modulation device as set forth in claim 5, wherein the correction circuit comprises a plurality of the correction tables, whereby when a select control signal is delivered thereto one of the plurality of correction tables is selected to output the correction output based on the selected correction table.

7. A signal amplifier apparatus comprising:

a delta-sigma modulator including a quantizer and a correction circuit to correct a quantization error of the quantizer by the correction circuit by feeding the output of the quantizer back to the input side of the modulator as a feedback signal;

a pulse width modulator for carrying out pulse width modulation of a signal outputted from the delta-sigma modulator;

an amplifier for amplifying a pulse width modulated signal outputted from the pulse width modulator to obtain an output signal, wherein distortion taking place in circuits connected to a succeeding stage of the delta-sigma modulator is corrected by the correction circuit;

further comprising detecting means for detecting distortion quantity of the amplifier from the pulse width modulated signal and the output signal of the amplifier to correct by the correction circuit the quantization error of the quantizer of the delta-sigma modulator in accordance with a distortion quantity detected the detecting means, wherein the detecting means comprises:

rising detecting a rising means for detecting time difference between a rising time point of the pulse width modulated signal and a rising time point of the output signal of the amplifier;

falling detecting means for detecting a falling time difference between a falling time point of the pulse width modulated signal and a falling time point of the output signal of the amplifier; and calculating means for calculating a distortion quantity in the amplifier from the rising time difference detected by the rising detecting means and the falling time difference detected by the falling detecting means, and a delay circuit provided at an input of one of the rising detecting means and the falling detecting means and serving to match a timing between the pulse width modulated signal and the output signal of the amplifier.

8. The signal amplifier apparatus as set forth in claim 7, wherein the correction circuit comprises a correction table in which the output of the quantizer and a correction output are stored in a manner associated with each other to output, as the feedback signal, the correction output corresponding to the output of the quantizer that has been delivered thereto.

9. A signal amplifier apparatus comprising:

a delta-sigma modulator;

a correction circuit for correcting a signal output from the delta-sigma modulator on the basis of a correction signal;

a pulse width modulator for carrying out pulse width modulation of a signal output from the correction circuit;

an amplifier for amplifying a pulse width modulated signal output from the pulse width modulator to obtain an output signal, wherein distortion taking place by a circuit connected to a succeeding stage of the delta-sigma modulator is corrected by the correction circuit; and detecting a distortion quantity in the amplifier from the pulse width modulated signal and the output signal of the amplifier to provide the correction signal corresponding to the detected distortion quantity, wherein the detecting means comprises:

rising detecting means for detecting a rising time difference between a rising time point of the pulse width modulated signal and a rising time point of the output signal of the amplifier;

falling detecting means for detecting a falling time difference between a falling time point of the pulse width modulated signal and a falling time point of the output signal of the amplifier;

calculating means for calculating the distortion quantity in the amplifier from the rising time difference detected by the rising detecting means and the falling time difference detected by the falling detecting means; and wherein the detecting means comprises a delay circuit provided at an input side of one of the rising detecting means and the falling detecting means, and serving to match a timing between the pulse width modulated signal and the output signal of the amplifier.

10. The signal amplifier apparatus as set forth in claim 9, wherein the correction circuit comprises a correction table in which an output of the delta-sigma modulator and a correction output are stored in a manner associated with each other, so as to output to the pulse width modulator the correction output corresponding to the output of the delta-sigma modulator.

* * * * *